(12) United States Patent
Park et al.

(10) Patent No.: US 12,323,720 B2
(45) Date of Patent: Jun. 3, 2025

(54) IMAGE SENSOR

(71) Applicant: SAMSUNG ELECTRONICS CO., LTD., Suwon-si (KR)

(72) Inventors: Jueun Park, Suwon-si (KR); Sanghyuck Moon, Suwon-si (KR); Seyoung Kim, Suwon-si (KR); Jaeho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 189 days.

(21) Appl. No.: 18/201,947

(22) Filed: May 25, 2023

(65) Prior Publication Data

US 2024/0114262 A1    Apr. 4, 2024

(30) Foreign Application Priority Data

Sep. 30, 2022   (KR) .......................... 10-2022-0125393

(51) Int. Cl.
*H04N 25/77*     (2023.01)
*H04N 25/778*    (2023.01)
*H10F 39/18*     (2025.01)

(52) U.S. Cl.
CPC .................................. *H04N 25/77* (2023.01)

(58) Field of Classification Search
CPC ...... H04N 25/70; H04N 25/778; H04N 25/77; H10F 39/18; H10F 39/802; H10F 39/8037; H10F 39/811; H10F 39/813
See application file for complete search history.

(56) References Cited

U.S. PATENT DOCUMENTS

| | | |
|---|---|---|
| 11,330,217 B2 | 5/2022 | Lee |
| 2013/0049082 A1 | 2/2013 | Kato et al. |
| 2018/0294297 A1 | 10/2018 | Yun et al. |
| 2021/0358994 A1 | 11/2021 | Lee et al. |
| 2023/0328408 A1* | 10/2023 | Jin ...................... H10F 39/8053 |
| 2024/0186359 A1* | 6/2024 | Lim ...................... H10F 39/024 |
| 2025/0024168 A1* | 1/2025 | Kim .................... H04N 25/533 |

FOREIGN PATENT DOCUMENTS

| | | |
|---|---|---|
| CN | 113675228 | 11/2021 |
| KR | 10-2013-0021330 | 3/2013 |
| KR | 10-2406996 | 6/2022 |
| WO | 2022067455 | 4/2022 |
| WO | 2022110135 | 6/2022 |

* cited by examiner

*Primary Examiner* — Marly S Camargo
(74) *Attorney, Agent, or Firm* — MORGAN, LEWIS & BOCKIUS LLP

(57) ABSTRACT

An image sensor includes: a pixel array including a plurality of pixels, wherein each of the pixels includes first and second photodiodes, first and second transfer gates, and a plurality of active regions; and a logic circuit. Each of a plurality of pixel groups in the pixel array includes a first pixel and a second pixel. The active regions in each of the first pixel and the second pixel include a first active region and a second active region. The first active region is adjacent to the first transfer gate. The second active region is adjacent to the second transfer gate. In each of the pixel groups, a plurality of source-follower transistors respectively has a gate connected to the first and second active regions of the first pixel and connected to the first and second active regions of the second pixel. The source-follower transistors are in the first pixel.

20 Claims, 30 Drawing Sheets

IMAGE SENSOR

CROSS-REFERENCE TO RELATED APPLICATION

This application claims priority under 35 U.S.C. § 119(a) to Korean Patent Application No. 10-2022-0125393 filed on Sep. 30, 2022, in the Korean Intellectual Property Office, the disclosure of which is incorporated by reference herein in its entirety.

TECHNICAL FIELD

The present inventive concept relates to an image sensor.

DISCUSSION OF THE RELATED ART

Generally, an image sensor, such as a semiconductor-based sensor receiving light and generating an electrical signal, may include a pixel array, which has a plurality of pixels, and a logic circuit for driving the pixel array and for generating an image. Each of the pixels may include a photodiode and a pixel circuit that converts a charge generated by the photodiode into an electrical signal. As the number of pixels included in the image sensor increases and a size of each of the pixels decreases, methods for forming transistors that are disposed in each of the pixels to provide a pixel circuit have been increasingly desired and have been under development.

SUMMARY

According to an example embodiment of the present inventive concept, an image sensor includes: a pixel array including a plurality of pixels, wherein each of the plurality of pixels includes a first photodiode, a second photodiode, a first transfer gate, a second transfer gate, and a plurality of active regions; and a logic circuit configured to control the plurality of pixels, wherein each of a plurality of pixel groups in the pixel array includes a first pixel and a second pixel among the plurality of pixels, and the first pixel and the second pixel are adjacent to each other in a first direction, wherein the plurality of active regions in each of the first pixel and the second pixel include a first active region and a second active region, wherein the first active region is adjacent to the first transfer gate, and the second active region is adjacent to the second transfer gate, and wherein in each of the plurality of pixel groups, a plurality of source-follower transistors respectively has a gate connected to the first active region and the second active region of the first pixel and connected to the first active region and the second active region of the second pixel, wherein the plurality of source-follower transistors are disposed in the first pixel, and a plurality of switch transistors are disposed in the second pixel.

According to an example embodiment of the present inventive concept, an image sensor includes: a pixel array including a plurality of pixel groups respectively including a first pixel and a second pixel that are adjacent to each other in a first direction; and a logic circuit configured to drive the pixel array, wherein each of the plurality of pixel groups includes a plurality of photodiodes, first to fourth active regions, a plurality of source-follower transistors disposed in the first pixel, and a plurality of switch transistors disposed in the second pixel, wherein the plurality of photodiodes includes at least one photodiode disposed in the first pixel and at least one photodiode disposed in the second pixel, wherein the first to fourth active regions are connected to each other by at least one of first interconnection patterns to provide a single floating diffusion region, wherein the floating diffusion region included in a first pixel group, among the plurality of pixel groups, is connected to a floating diffusion region included in a second pixel group adjacent to the first pixel group, wherein in each of the plurality of pixel groups, the plurality of switch transistors include first to third reset transistors connected to each other in series between a power node, which supplies a power voltage, and the floating diffusion region, and wherein a first node among nodes that are between the first to third reset transistors, which are included in the first pixel group, is connected to a second node among nodes that are between the first to third reset transistors, which are included in the second pixel group.

According to an example embodiment of the present inventive concept, an image sensor includes: a substrate including a plurality of pixel regions; a plurality of pixels disposed in the plurality of pixel regions, respectively, wherein each of the plurality of pixels includes a first photodiode, a second photodiode, a first transfer gate, a second transfer gate, and a plurality of active regions; and a logic circuit connected to the plurality of pixels, wherein the plurality of pixels provide a plurality of pixel groups, wherein each of the plurality of pixel groups includes a first pixel and a second pixel adjacent to each other in a first direction, each of the first pixel and the second pixel includes a plurality of transistors including gate structures and a portion of the plurality of active regions, wherein the gate structures are different from the first transfer gate and the second transfer gate, and in each of the plurality of pixel groups, a number of the plurality of transistors disposed in the first pixel is different from a number of the plurality of transistors disposed in the second pixel.

BRIEF DESCRIPTION OF DRAWINGS

The above and other aspects of the present inventive concept will become more apparent by describing in detail example embodiments thereof, with reference to the accompanying drawings, in which.

DETAILED DESCRIPTION OF THE EMBODIMENTS

Hereinafter, example embodiments of the present inventive concept will be described with reference to the accompanying drawings.

Figure 1:
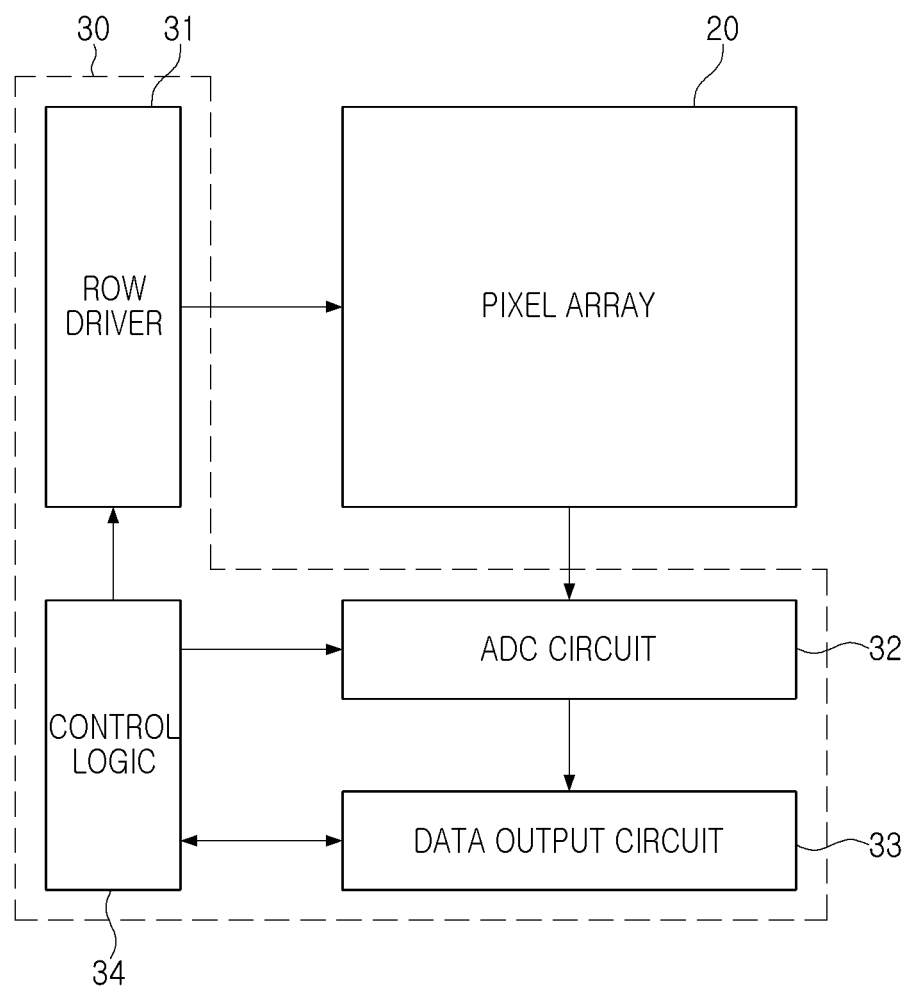
FIG. 1 is a schematic block diagram illustrating an image sensor according to an example embodiment of the present inventive concept.

FIG. 1 is a schematic block diagram illustrating an image sensor according to an example embodiment of the present inventive concept.

Referring to FIG. 1, an image sensor 10 may include a pixel array 20 and a peripheral circuit 30.

The pixel array 20 may include a plurality of pixels arranged in array form with a plurality of rows and a plurality of columns. Each of the plurality of pixels may include at least one photoelectric conversion element generating a charge in response to light, and a pixel circuit generating a voltage signal corresponding to the charge generated by the photoelectric conversion element. The photoelectric conversion element may include a photodiode formed of a semiconductor material and/or an organic photodiode formed of an organic material.

For example, the pixel circuit may include a floating diffusion region, a transfer transistor, a reset transistor, a driving transistor, a selection transistor, and the like. A configuration of pixels may vary depending on example embodiments of the present inventive concept. For example, each of the pixels may include an organic photodiode including an organic material, or may be implemented as a digital pixel. When the pixels are implemented as digital pixels, each of the pixels may include an analog-to-digital converter (ADC) for outputting a digital pixel signal.

The peripheral circuit 30 may include circuits for controlling the pixel array 20. For example, the peripheral circuit 30 may include a row driver 31, an ADC circuit 32, a data output circuit 33, a control logic 34, and the like. The row driver 31 may drive the pixel array 20 in units of row lines. For example, the row driver 31 may generate a transfer control signal for controlling a transfer transistor of a pixel circuit, a reset control signal for controlling a reset transistor, a selection control signal for controlling a selection transistor, and the like to input the generated signals into the pixel array 20 in units of row lines.

The ADC circuit 32 may include a plurality of correlated double samplers and a plurality of counters, and the correlated double samplers may be connected through pixels and column lines. The correlated double samplers may read a voltage signal, through column lines, from pixels that are connected to a row line selected by a row line selection signal from the row driver 31. An ADC included in an ADC circuit 33 may convert an output of the correlated double sampler into a digital pixel signal. For example, a latch capable of temporarily storing a digital pixel signal or a buffer circuit, an amplification circuit, and the like may be connected to an output terminal of the ADC. The control logic 34 may include a timing controller for controlling operation timings of the row driver 31, the ADC circuit 32, and the data output circuit 33.

Among the pixels PX of the pixel array 20, at least some pixels PX disposed in the same position in a horizontal direction may share the same column line. For example, pixels PX disposed in the same position in a vertical direction are simultaneously selected by the row driver 31, and may output a pixel signal through column lines. In an example embodiment of the present inventive concept, the ADC circuit 32 may simultaneously receive a voltage signal from pixels selected by the row driver 31 through the column lines. For example, the ADC circuit 32 may sequentially receive a reset voltage and a pixel voltage from each of the pixels, and the pixel voltage may be a voltage obtained by reflecting a charge generated by a photodiode of each of the pixels to the reset voltage.

In an operation of acquiring pixel data for generating an image, the logic circuit 30 may acquire pixel data from active pixels that are disposed in an active region 21 as well as dummy pixels that are disposed in an optical black region 22. The dummy pixels may include a light blocking layer that may block light introduced from the outside, such that the pixel data acquired from the dummy pixels may be data corresponding to a charge generated by a cause other than light, for example, dark current. The logic circuit 30 may subtract the pixel data, acquired from the dummy pixels, from the pixel data acquired from the active pixels, thereby minimizing the influence resulting from a cause other than light introduced from the outside.

Figure 2:
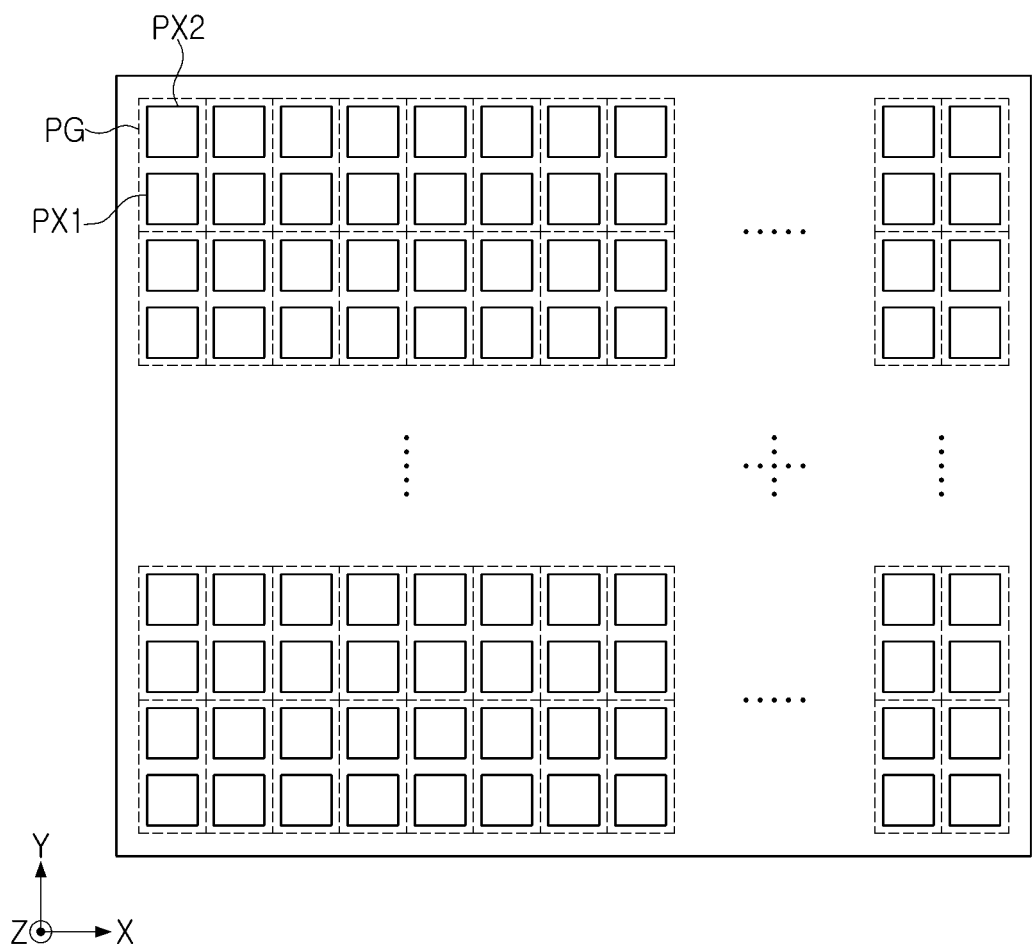
FIG. 2 is a schematic diagram illustrating a pixel array included in an image sensor according to an example embodiment of the present inventive concept.

FIG. 2 is a schematic diagram illustrating a pixel array included in an image sensor according to an example embodiment of the present inventive concept.

Referring to FIG. 2, a pixel array 40 according to an example embodiment of the present inventive concept may include a plurality of pixel regions arranged in a first direction (Y-axis direction) and a second direction (X-axis direction), and a plurality of pixels may be disposed in the plurality of pixel regions. For example, the plurality of pixel regions may correspond to the plurality of pixels, respectively. The plurality of pixels may be configured to output a voltage signal corresponding to a charge generated in response to light, and may be connected to a peripheral circuit by a plurality of column lines extending in a first direction and a plurality of row lines extending in a second direction.

As illustrated in FIG. 2, in the image sensor according to an example embodiment of the present inventive concept, a first pixel PX1 and a second pixel PX2 adjacent to each other in the first direction may be included in a single pixel group PG. Accordingly, in the pixel array 40, a plurality of pixel groups PG may be arranged in the first and second directions. In the example embodiment illustrated in FIG. 2, the first pixel PX1 and the second pixel PX2 included in each of the plurality of pixel groups PG may be adjacent to each other in the first direction, but the present inventive concept is not necessarily limited to such a form.

For example, in each of the plurality of pixel groups PG, the first pixel PX1 and the second pixel PX2 may be adjacent to each other in the second direction. In addition, the first pixel PX1 and the second pixel PX2 may be adjacent to each other in the first direction in at least a portion of the plurality of pixel groups PG, and the first pixel PX1 and the second pixel PX2 may be adjacent to each other in the second direction in the other portion.

In each of the plurality of pixel groups PG, a floating diffusion region of the first pixel PX1 and a floating diffusion region of the second pixel PX2 may be connected to each other. In addition, a plurality of transistors disposed in a pixel region of the first pixel PX1 and a plurality of transistors disposed in a pixel region of the second pixel PX2 may provide a pixel circuit that converts a charge generated by a photodiode of each of the first pixel PX1 and the second pixel PX2 into a voltage signal. For example, transistors operating as an amplifier may be disposed in one of the first pixel PX1 or the second pixel PX2, and transistors operating as a switch may be disposed in the other one of the first pixel PX1 and the second pixel PX2.

Each of the plurality of pixel groups PG may include a pair of pixels PX1 and PX2, and a pixel circuit may be implemented with transistors, which are disposed in the pair of pixels PX1 and PX2, thereby shortening a length of an interconnection pattern connecting floating diffusion regions disposed in each of the pixel groups PG to each other. Accordingly, the image sensor may have increased performance in a low-illuminance environment by increasing a conversion gain of each of the plurality of pixel groups PG. In addition, in a high-level illuminance environment, floating diffusion regions of two or more adjacent pixel groups PG in the first direction or the second direction may be selectively connected to each other, thereby preventing saturation of a photodiode of each of the plurality of pixels, and increasing maximum brightness expressed by the image sensor.

Figure 3:
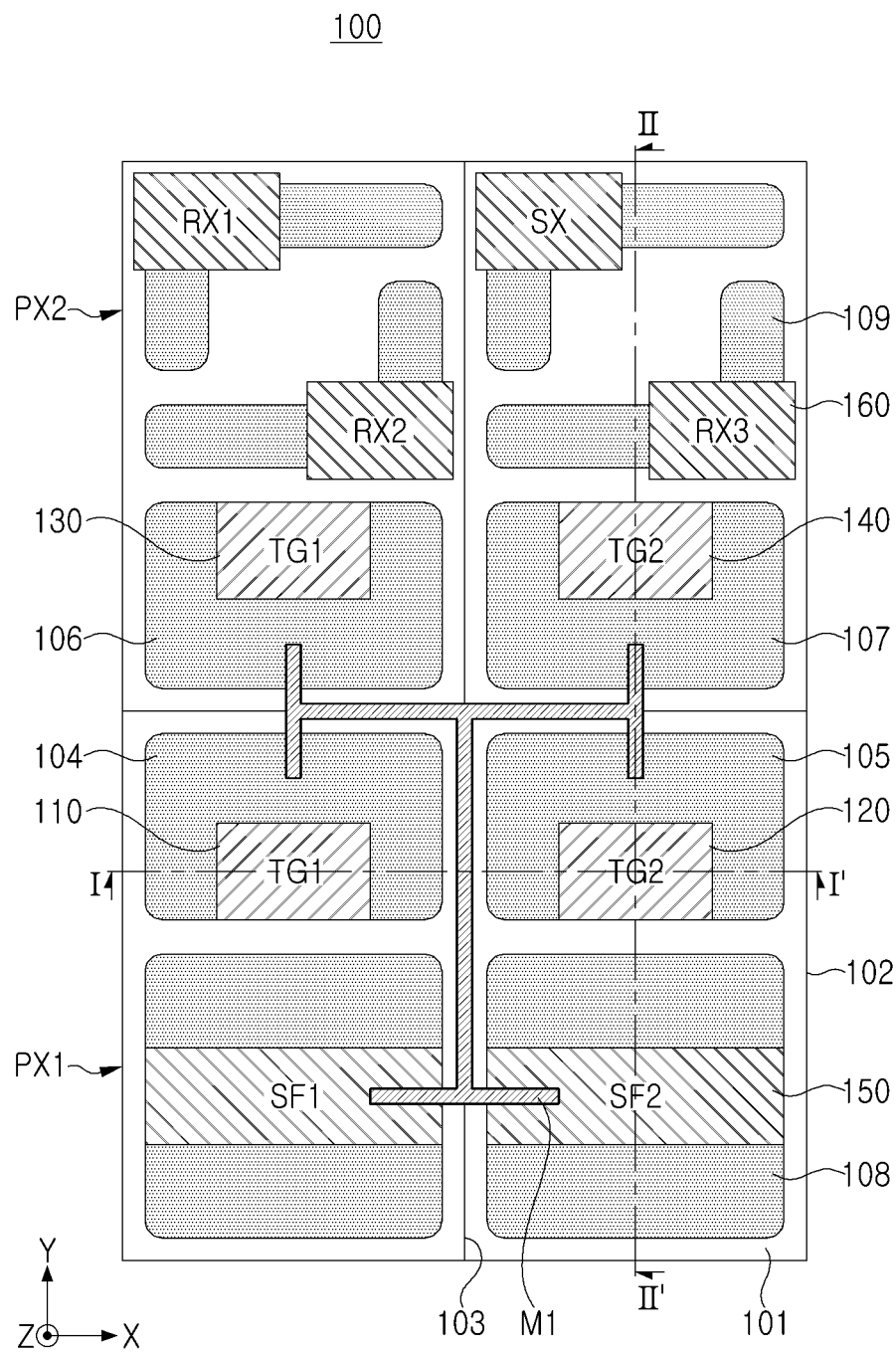
FIG. 3 is a schematic diagram illustrating some pixels included in an image sensor according to an example embodiment of the present inventive concept.
Figure 4:
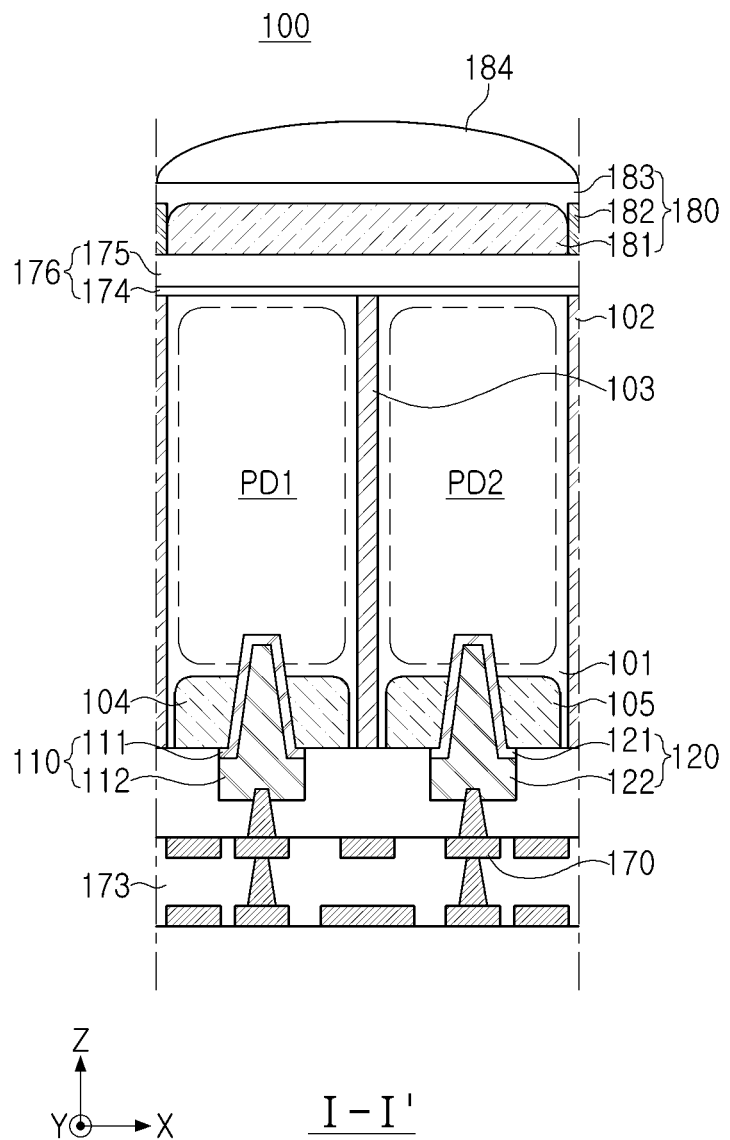
FIG. 4 is a cross-sectional view of an image sensor taken along line I-I' of FIG. 3.
Figure 5:
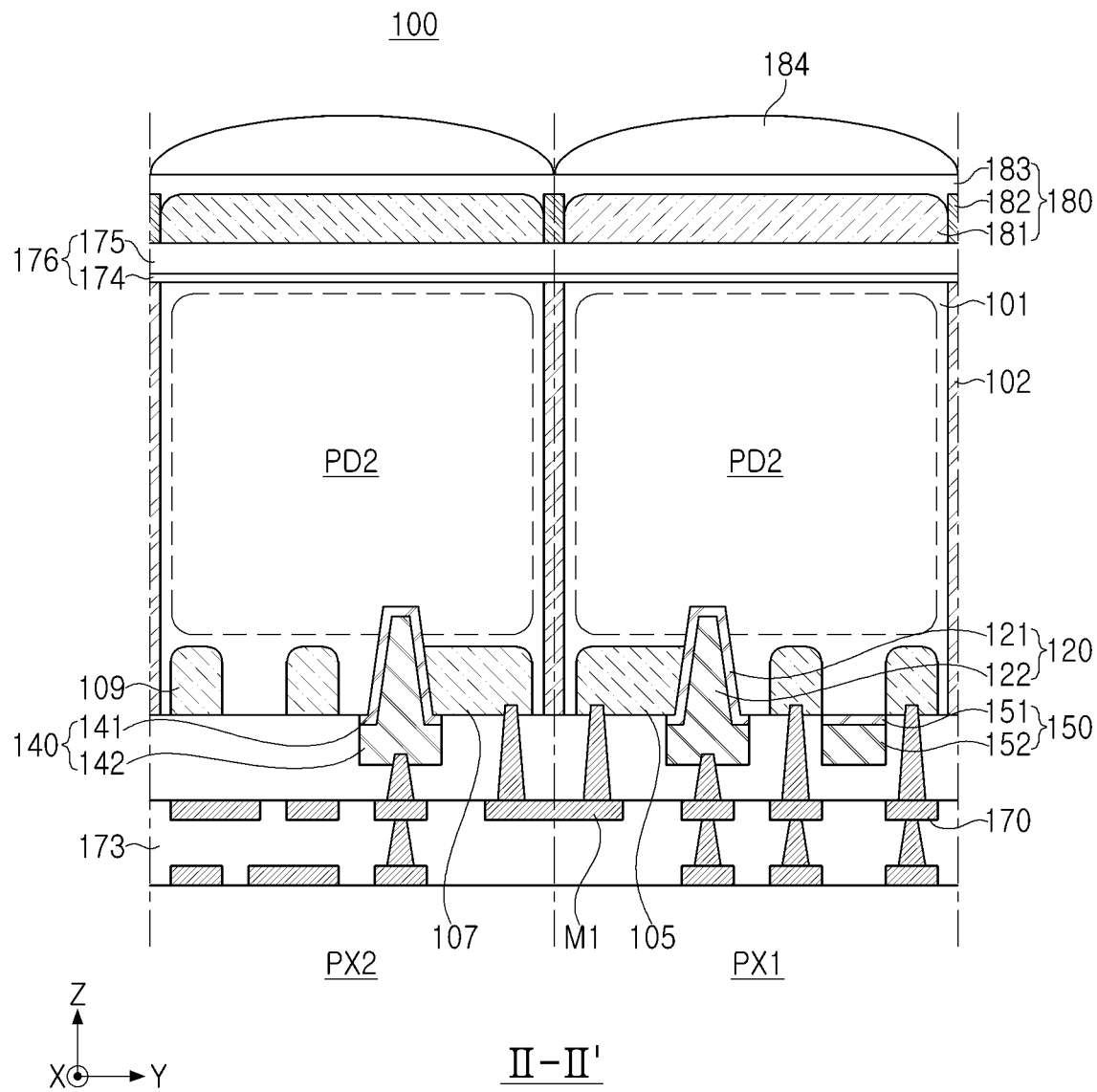
FIG. 5 is a cross-sectional view of an image sensor taken along line II-II' of FIG. 3.

FIG. 3 is a schematic diagram illustrating some pixels included in an image sensor according to an example embodiment of the present inventive concept. FIG. 4 is a cross-sectional view of an image sensor taken along line I-I' of FIG. 3. FIG. 5 is a cross-sectional view of an image sensor taken along line II-II' of FIG. 3.

FIG. 3 may be a plan view illustrating one pixel group of a plurality of pixel groups disposed in a pixel array of an image sensor 100 according to an example embodiment of the present inventive concept. In the example embodiment described with reference to FIGS. 3 to 5, a single pixel group may include a first pixel PX1 and a second pixel PX2 adjacent to the first pixel PX1 in a first direction (Y-axis direction). Each of the first pixel PX1 and the second pixel PX2 may include a first photodiode PD1 and a second photodiode PD2 adjacent to each other in a second direction (X-axis direction).

A plurality of pixel regions in which the first pixel PX1 and the second pixel PX2 are disposed may be defined by an external pixel isolation film 102. The external pixel isolation film 102 may extend in the first and second directions, and may pass through a substrate 101. An internal pixel isolation film 103 may be disposed between the first photodiode PD1 and the second photodiode PD2 in each of the first pixel PX1 and the second pixel PX2. The internal pixel isolation film 103 may extend in the first direction, and may pass through the substrate 101 in the same manner as the external pixel isolation film 102.

However, in some example embodiments of the present inventive concept, the internal pixel isolation film 103 may have a length shorter than that of the external pixel isolation film 102 in a third direction (Z-axis direction). In this case, a charge may move between the first photodiode PD1 and the second photodiode PD2 through a region in which the internal pixel isolation film 103 is not formed.

A first transfer gate 110 and a second transfer gate 120 are disposed in the first pixel PX1, and a first transfer gate 130 and a second transfer gate 140 are disposed in the second pixel PX2. At least a portion of a region of each of the transfer gates 110 to 140 may be disposed in the substrate 101, as illustrated in FIGS. 4 and 5. Accordingly, each of the transfer gates 110 to 140 may be adjacent to the first photodiode PD1 or the second photodiode PD2 in the substrate 101. Referring to the first pixel PX1 as an example, each of the first transfer gate 110 and the second transfer gate 120 may include gate insulating layers 111 and 121 and gate electrode layers 112 and 122.

Each of the transfer gates 110 to 140 may be adjacent to one of floating diffusion regions 104 to 107 in a direction, parallel to an upper surface of the substrate 101. For example, in the first pixel PX1, the first transfer gate 110 may be adjacent to a first floating diffusion region 104, and the second transfer gate 120 may be adjacent to a second floating diffusion region 105. Similarly, in the second pixel PX2, the first transfer gate 130 may be adjacent to a first floating diffusion region 106, and the second transfer gate 140 may be adjacent to a second floating diffusion region 107. Each of the floating diffusion regions 104 to 107 may be a region doped with a predetermined impurity.

Each of the transistors disposed in the first pixel PX1 may include a gate structure 150 and an active region 108. Source-follower transistors SF1 and SF2 operating as an amplifier may be disposed in the first pixel PX1. Each of transistors disposed in the second pixel PX2 may be a switch transistor operating as a switch, and may include a gate structure 160 and an active region 109. First to third reset transistors RX1 to RX3 and a selection transistor SX may be disposed in the second pixel PX2.

As illustrated in FIG. 3, an area of each of the transistors disposed in the first pixel PX1 may be greater than an area of each of the transistors disposed in the second pixel PX2. For example, the gate structure 150 disposed in the first pixel PX1 may have an area larger than that of the gate structure 160 disposed in the second pixel PX2. In addition, the active region 108 disposed in the first pixel PX1 may have an area larger than that of the active region 109 disposed in the second pixel PX2. As described above, each of the source-follower transistors SF1 and SF2 operating as an amplifier may be formed to have an area larger than that of each of the switch transistors RX1 to RX3 and SX, thereby improving a signal-to-noise ratio of a voltage signal output by a pixel circuit.

In the example embodiment illustrated FIGS. 3 to 5, a smaller number of transistors may be disposed in the first pixel PX1 than in the second pixel PX2 such that each of the source-follower transistors SF1 and SF2 has an area larger than each of the switch transistors RX1 to RX3 and SX. For example, the number of transistors disposed in the second pixel PX2 may be twice the number of transistors disposed in the first pixel PX1.

Each of the first to third reset transistors RX1 to RX3 and the selection transistor SX1 disposed in the second pixel PX2 may perform an ON/OFF-based switch operation, unlike the source-follower transistors SF1 and SF2 disposed in the first pixel PX1. Accordingly, the first to third reset transistors RX1 to RX3 and the selection transistor SX1 may be implemented to have a size smaller than that of the source-follower transistors SF1 and SF2.

To arrange more transistors in the same or similar area, a pair of active regions 109 included in each of the transistors RX1 to RX3 and SX of the second pixel PX2 may extend in different directions. For example, in the first reset transistor RX1, one of the active regions 109 adjacent to the gate structure 160 may extend in the first direction, and another active region 109 may extend in the second direction.

The source-follower transistors SF1 and SF2 disposed in the first pixel PX1, the switch transistors RX1 to RX3 and SX disposed in the second pixel PX2, and the floating diffusion regions 104 to 107 and the transfer gates 110 to 140, disposed in the first pixel PX1 and the second pixel PX2, may be connected to each other by a plurality of interconnection patterns 170 disposed on the substrate 101. For example, the plurality of interconnection patterns 170 may include a contact extending in the third direction and metal interconnections extending in the first and/or second directions, and may be disposed in an interlayer insulating layer 173.

For example, the active regions 104 to 107, disposed in the first pixel PX1 and the second pixel PX2 and providing a floating diffusion region, may be electrically connected to each other by at least one first interconnection pattern M1. The first interconnection pattern M1, providing the floating diffusion region, may be closest to one surface of the substrate 101, out of a plurality of interconnection patterns. The first interconnection pattern M1 may connect the active regions 104 to 107, included in the floating diffusion region, to the gate structure 150 of each of the source-follower transistors SF1 and SF2 disposed in the first pixel PX1. As illustrated in FIGS. 3 and 5, the first interconnection pattern M1 may cross a boundary between the first pixel PX1 and the second pixel PX2, and may be disposed on the external pixel isolation film 102 disposed between the first pixel PX1 and the second pixel PX2. In an example embodiment of the present inventive concept, the first interconnection pattern M1 may be isolated from the gate structure 160 of each of the first to third reset transistors RX1, RX2, and RX3 and the selection transistor SX in the second pixel PX2.

An optical region including a horizontal insulating layer 176, a color filter layer 180, a micro lens 184, and the like may be provided on the substrate 101. The horizontal insulating layer 176 may include a first horizontal insulating layer 174 and a second horizontal insulating layer 175. The first horizontal insulating layer 174 may be disposed on the substrate 101, and the second horizontal insulating layer 175 may be disposed on the first horizontal insulating layer 174. For example, the first horizontal insulating layer 174 may be in contact with the substrate 101 and may be formed of a material having a dielectric constant higher than that of the second horizontal insulating layer 175. The first horizontal insulating layer 174 may have a thickness less than that of the second horizontal insulating layer 175, and some defects of the substrate 101 may be cured by the first horizontal insulating layer 174.

The color filter layer 180 may include a color filter 181, a filter isolation film 182, a planarization layer 183, and the like. The filter isolation film 182 may extend in the first and second directions in a similar manner to the internal pixel isolation film 103, and thus the color filter 181 may be arranged along the plurality of pixel regions. The planarization layer 183 may be disposed on the color filter 181, and a micro lens 184 may be disposed on the planarization layer 183. The micro lens 184 may refract light incident from the outside and pass the light to the color filter 180, and light having a specific wavelength band may be selectively incident on the photodiodes PD1 and PD2 by the color filter 180.

Figure 6:
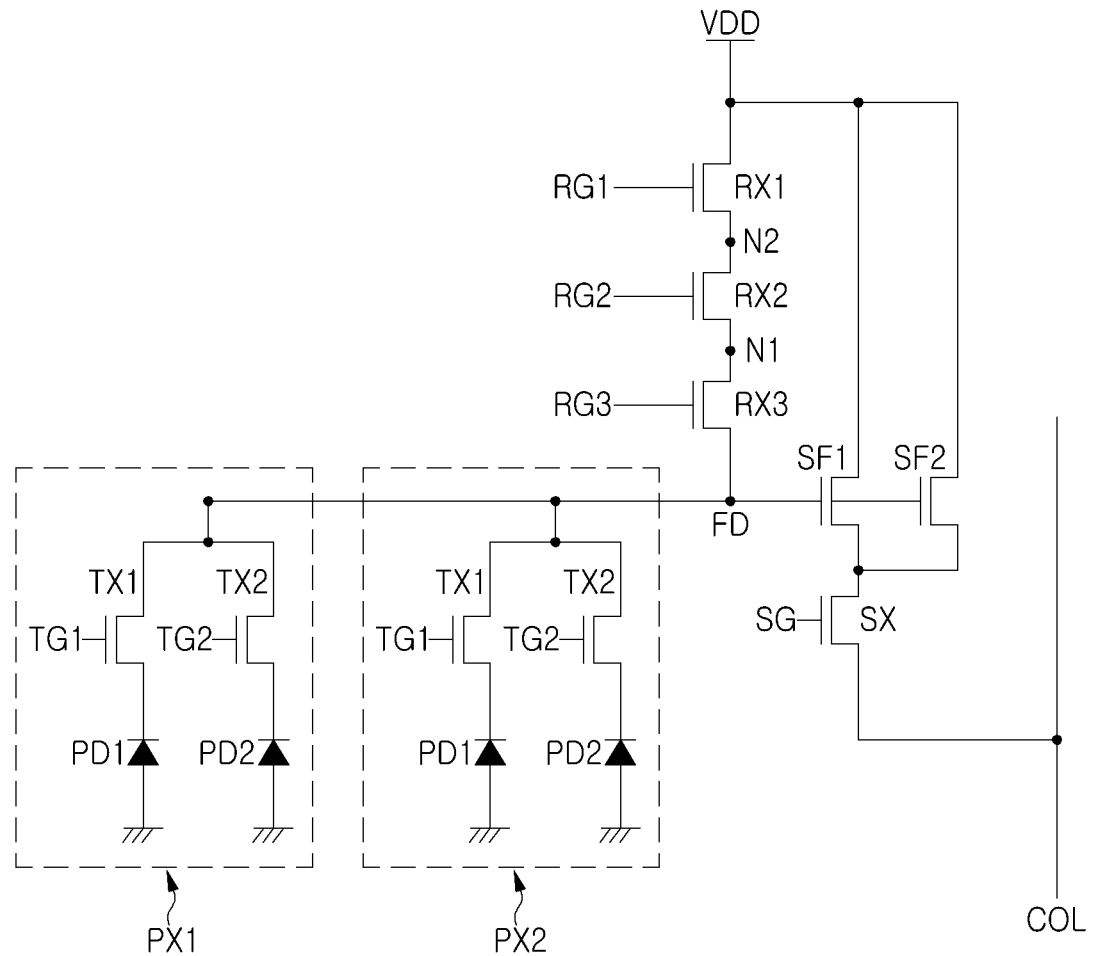
FIG. 6 is a schematic circuit diagram illustrating a pixel of an image sensor according to an example embodiment of the present inventive concept.

FIG. 6 is a schematic circuit diagram illustrating a pixel of an image sensor according to an example embodiment of the present inventive concept.

FIG. 6 may be a schematic circuit diagram illustrating a pixel circuit provided by a single pixel group. Referring to FIG. 6, the single pixel group may include a first pixel PX1 and a second pixel PX2. As described above, each of the first pixel PX1 and the second pixel PX2 may include a first photodiode PD1, a second photodiode PD2, a first transfer transistor TX1 connected to the first photodiode PD1, and a second transfer transistor TX2 connected to the second photodiode PD2. The first transfer transistor TX1 may include a first transfer gate, and may be controlled by a first transfer control signal TG1. Similarly, the second transfer transistor TX2 may include a second transfer gate, and may be controlled by a second transfer control signal TG2.

The transfer transistors TX1 and TX2 may be connected to a floating diffusion region FD. The floating diffusion region FD may be provided by an active region included in each of the first pixel PX1 and the second pixel PX2. For example, as illustrated in FIG. 3, the floating diffusion region FD may be provided by two or more active regions connected to each other by an interconnection pattern.

The floating diffusion region FD may be connected to gates of source-follower transistors SF1 and SF2 that are operating as an amplifier. The source-follower transistors SF1 and SF2 may be connected to each other in parallel. Input terminals of the source-follower transistors SF1 and SF2 may be connected to a power node supplying a power voltage VDD, and output terminals of the source-follower transistors SF1 and SF2 may be connected to a column line COL through a selection transistor SX. When the selection transistor SX is turned on by a selection control signal SG, the source-follower transistors SF1 and SF2 may amplify a voltage of the floating diffusion region FD and output the amplified voltage to the column line COL.

A plurality of reset transistors RX1 to RX3 may be connected to each other in series between the floating diffusion region FD and the power node. Referring to FIG. 6, the first to third reset transistors RX1 to RX3 may be sequentially connected from the power node. The first reset transistor RX1 may be connected to the power node. The third reset transistor RX3 may be connected to the floating diffusion region FD. The second reset transistor RX2 may be connected to the first reset transistor RX1 at a second node N2, and may be connected to the third reset transistor RX3 at a first node N1.

A capacitance of the floating diffusion region FD may vary depending on ON/OFF of the reset transistors RX1 to RX3. For example, when all of the reset transistors RX1 to RX3 are turned off, the capacitance of the floating diffusion region FD may be determined as a sum of capacitances of active regions providing the floating diffusion region FD in each of the first pixel PX1 and the second pixel PX2 and a capacitance of an interconnection pattern connecting the active regions to each other. Conversely, when the third reset transistor RX3 is turned on and the second reset transistor RX2 is turned off, a capacitance of the third reset transistor RX3 may be added to the capacitance of the floating diffusion region FD. Accordingly, a conversion gain of an image sensor may be reduced.

Both the second reset transistor RX2 and the third reset transistor RX3 may be turned on. In this case, the conversion gain of the image sensor may be further reduced, as compared to a case in which only the third reset transistor RX3 is turned on. As a result, in the image sensor according to an example embodiment of the present inventive concept, the conversion gain may be adjusted by controlling ON/OFF of the reset transistors RX1 to RX3. When the number of reset transistors RX1 to RX3 is N, the conversion gain of the image sensor may be selected as one of N different values, and N is a positive integer.

For example, in a low-illuminance environment in which a small amount of light is introduced into the photodiodes PD1 and PD2, both the second reset transistor RX2 and the third reset transistor RX3 may be turned off to increase the conversion gain of the image sensor. In addition, in a high-illuminance environment in which a large amount of light is introduced into the photodiodes PD1 and PD2, both the second reset transistor RX2 and the third reset transistor RX3 may be turned on to increase the capacitance of the floating diffusion region FD, thereby preventing saturation. In addition, ON/OFF of the second reset transistor RX2 and the third reset transistor RX3 may be changed to acquire pixel signals under different conversion gain conditions, and an image having a wide dynamic range may be generated using the pixel signals.

In the image sensor according to the example embodiment illustrated in FIG. 6, a peripheral circuit may separately acquire a first pixel signal, which corresponds to a charge generated by the first photodiode PD1 in each of the first and second pixels PX1 and PX2, and a second pixel signal, which corresponds to the charge generated by the second photodiode PD2 in each of the first and second pixels PX1 and PX2. The peripheral circuit may implement an autofocus function for determining a distance to a subject and focusing an image, using a phase difference between the first pixel signal and the second pixel signal.

Figure 7:
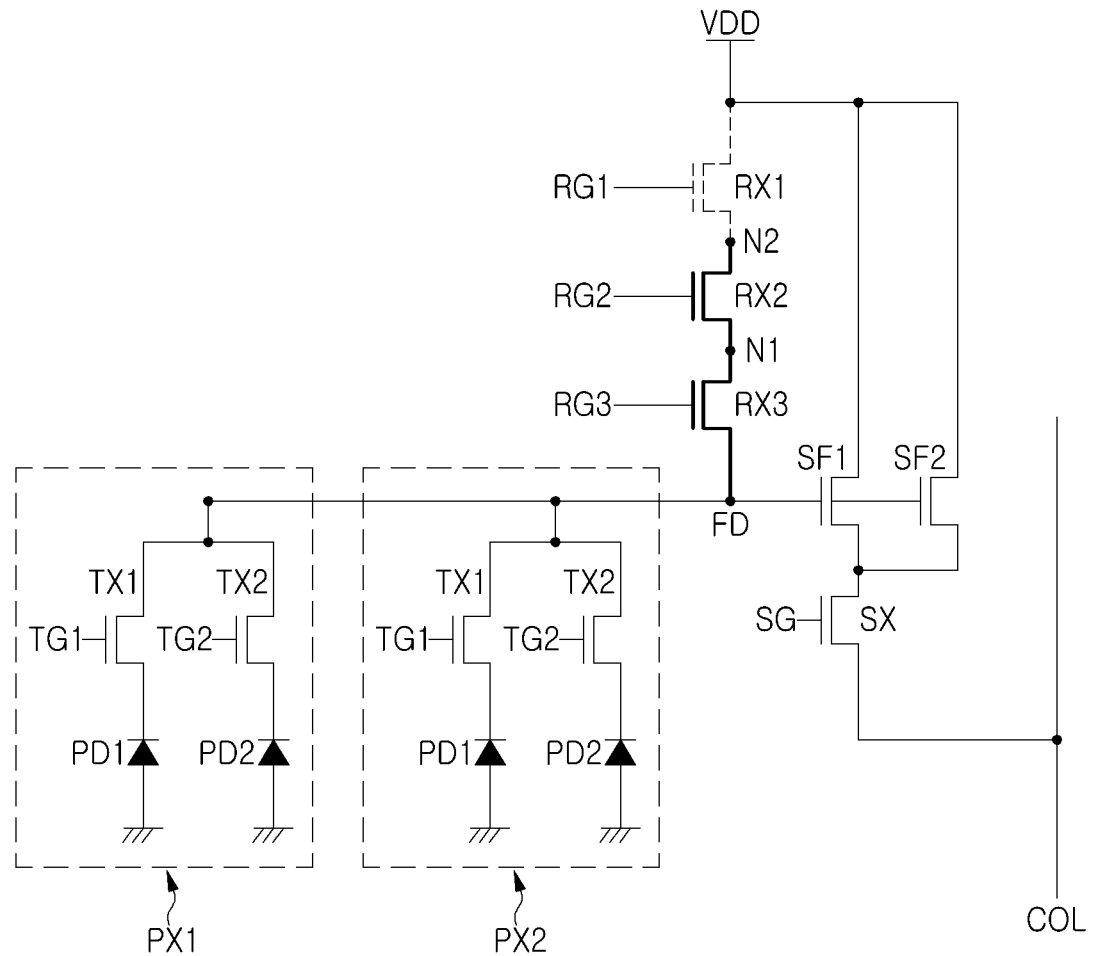
FIGS. 7, 8A, and 8B are diagrams illustrating an operation of an image sensor according to an example embodiment of the present inventive concept.
Figure 8A:
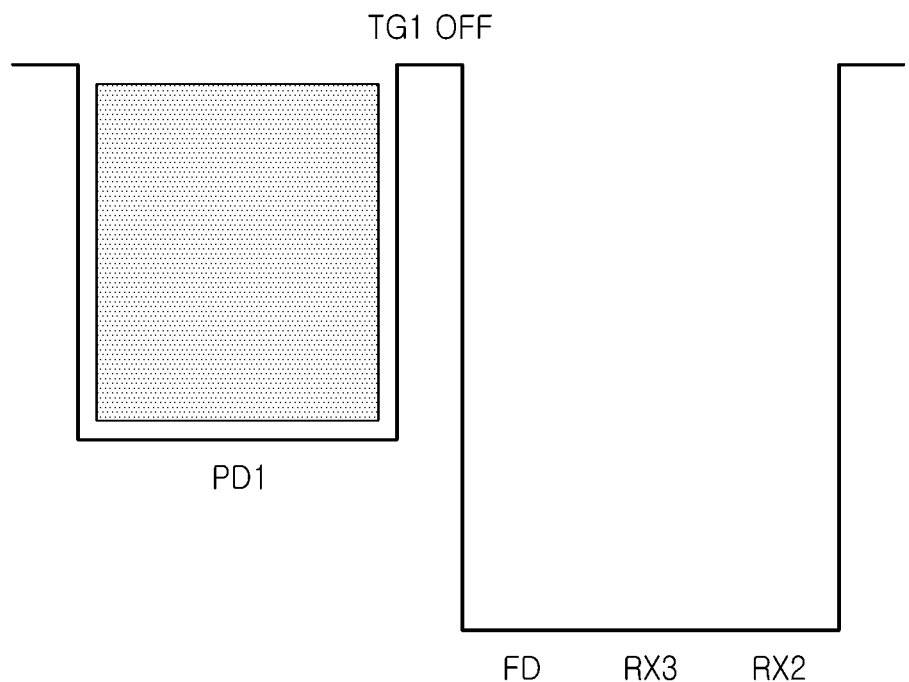
Figure 8B:
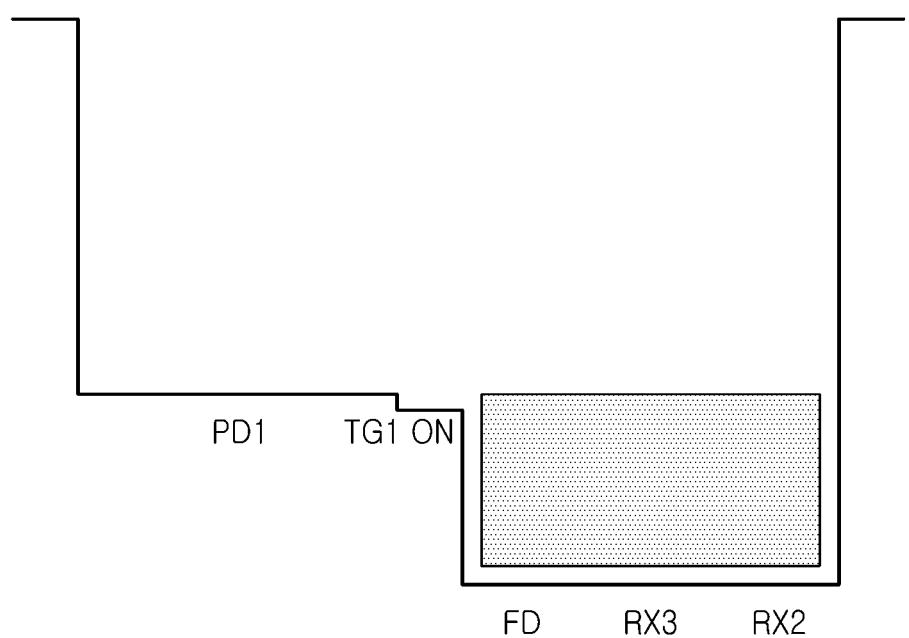

FIGS. 7, 8A, and 8B are diagrams illustrating an operation of an image sensor according to an example embodiment of the present inventive concept.

In the example embodiment illustrated in FIG. 7, the second reset transistor RX2 and the third reset transistor RX3 may be maintained in an ON state while a charge generated by each of the photodiodes PD1 and PD2 moves to the floating diffusion region FD. Accordingly, a capacitance of each of the second reset transistor RX2 and the third reset transistor RX3 is added to a capacitance of the floating diffusion region FD, and a conversion gain of the image sensor may be reduced. As described above, the example embodiment illustrated in FIG. 7 may correspond to an operation in a high-illuminance environment in which a large amount of light is introduced into the photodiodes PD1 and PD2.

Referring to FIG. 8A, while the first transfer transistor TX1 is maintained in an OFF state by the first transfer control signal TG1 and the first photodiode PD1 is exposed to light, the second reset transistor RX2 and the third reset transistor RX3 may be turned on to be connected to the floating diffusion region FD. Accordingly, as illustrated in FIG. 8B, when the first transfer transistor TX1 is turned on, a charge of the first photodiode PD1 may move to the floating diffusion region FD that has a high capacitance, and the image sensor may be saturated.

Figure 9:
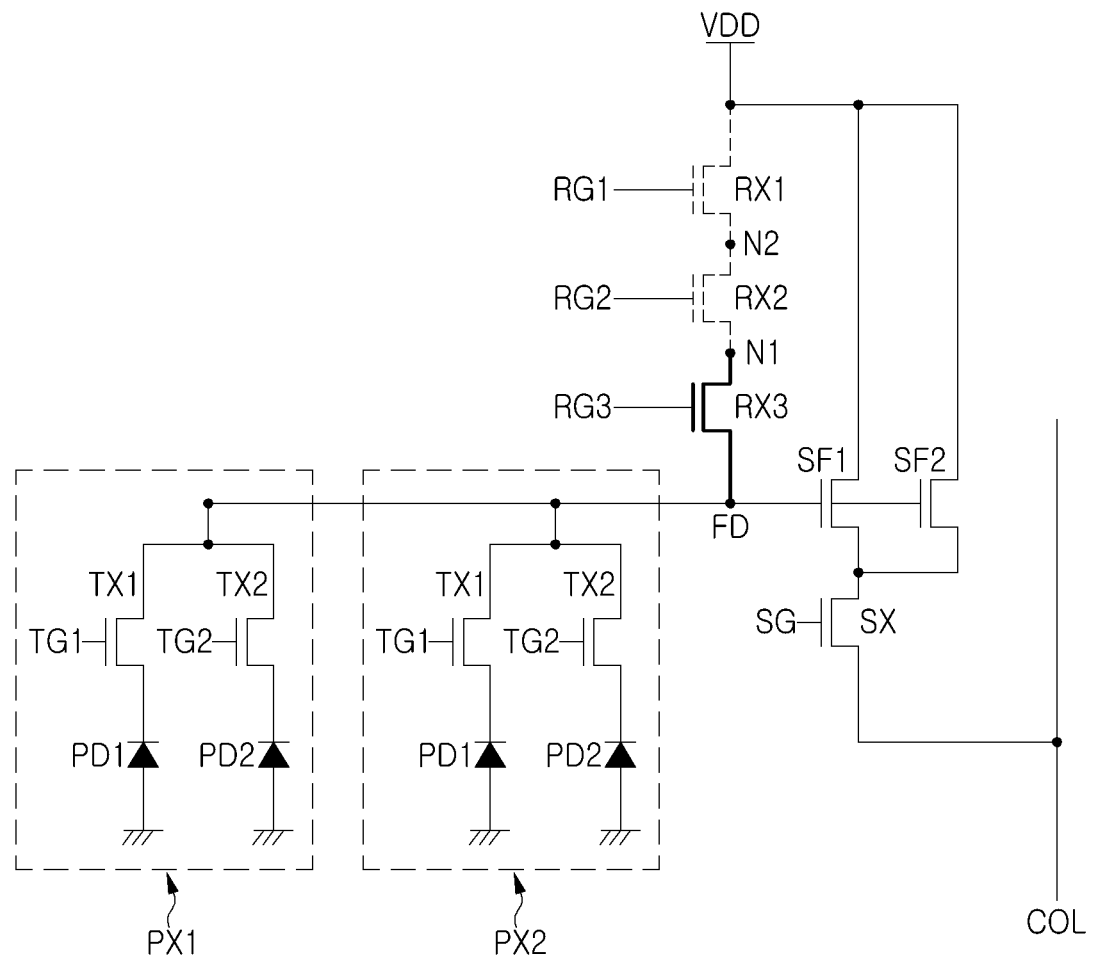
FIGS. 9, 10A, and 10B are diagrams illustrating an operation of an image sensor according to an example embodiment of the present inventive concept.
Figure 10A:
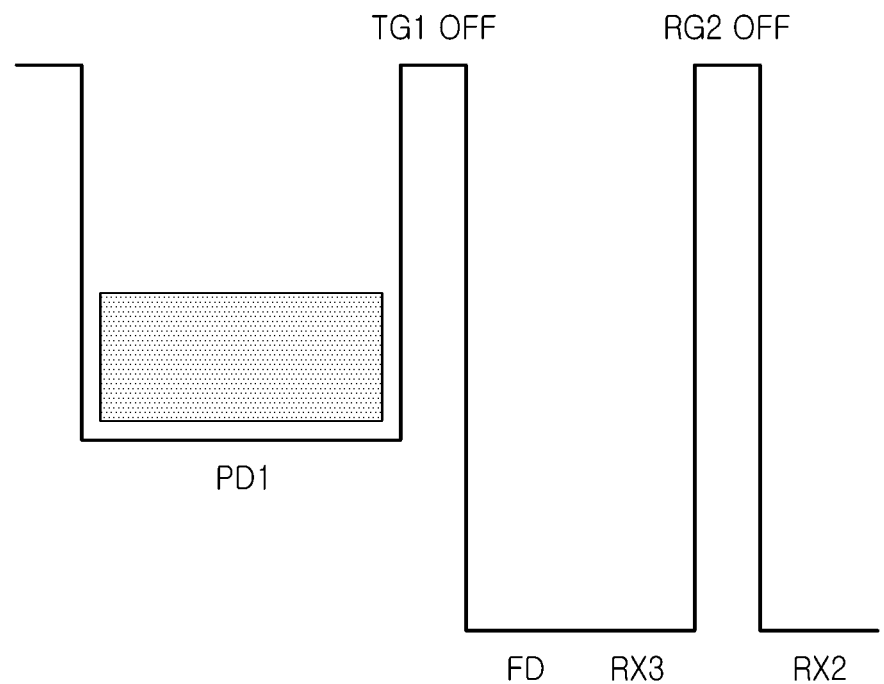
Figure 10B:
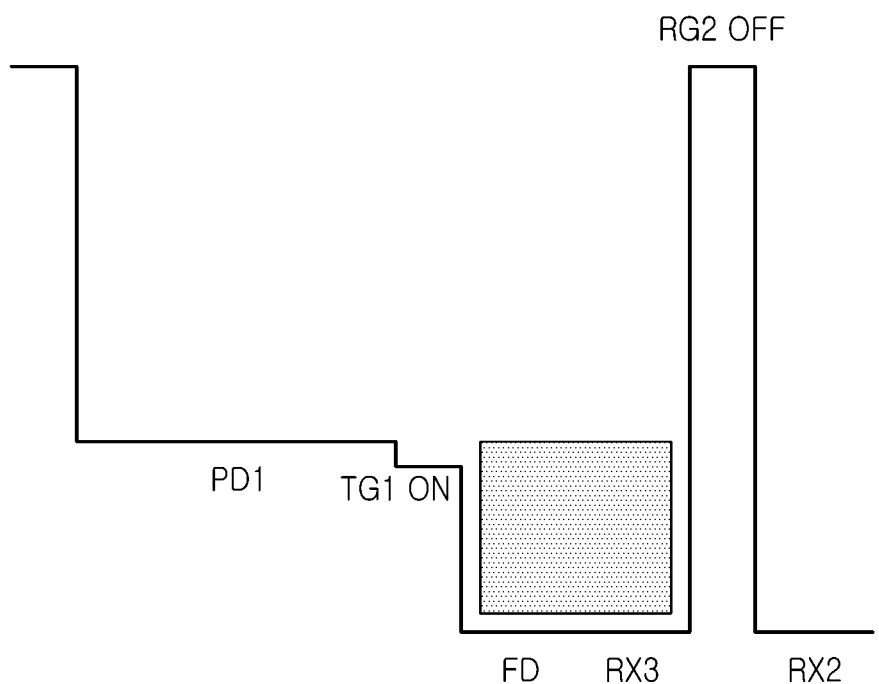

FIGS. 9, 10A, and 10B are diagrams illustrating an operation of an image sensor according to an example embodiment of the present inventive concept.

In the example embodiment illustrated in FIG. 9, the third reset transistor RX3 may be in an ON state while a charge generated by each of the photodiodes PD1 and PD2 moves to the floating diffusion region FD. Accordingly, a capacitance of the third reset transistor RX3 may be added to a capacitance of the floating diffusion region FD, and a conversion gain of the image sensor may be increased, as compared to the example embodiment illustrated in FIG. 7.

Referring to FIG. 10A, while the first transfer transistor TX1 is maintained in an OFF state by the first transfer control signal TG1 and the first photodiode PD1 is exposed to light, the third reset transistor RX3 may be turned on to be connected to the floating diffusion region FD. When the first transfer transistor TX1 is turned on, a charge of the first photodiode PD1 may move to the floating diffusion region FD and the turned-on third reset transistor RX3, as illustrated in FIG. 10B. Due to the second reset control signal RG2 turning off the second reset transistor TX2, a charge of the first photodiode PD1 might not move to the second node N2.

Figure 11:
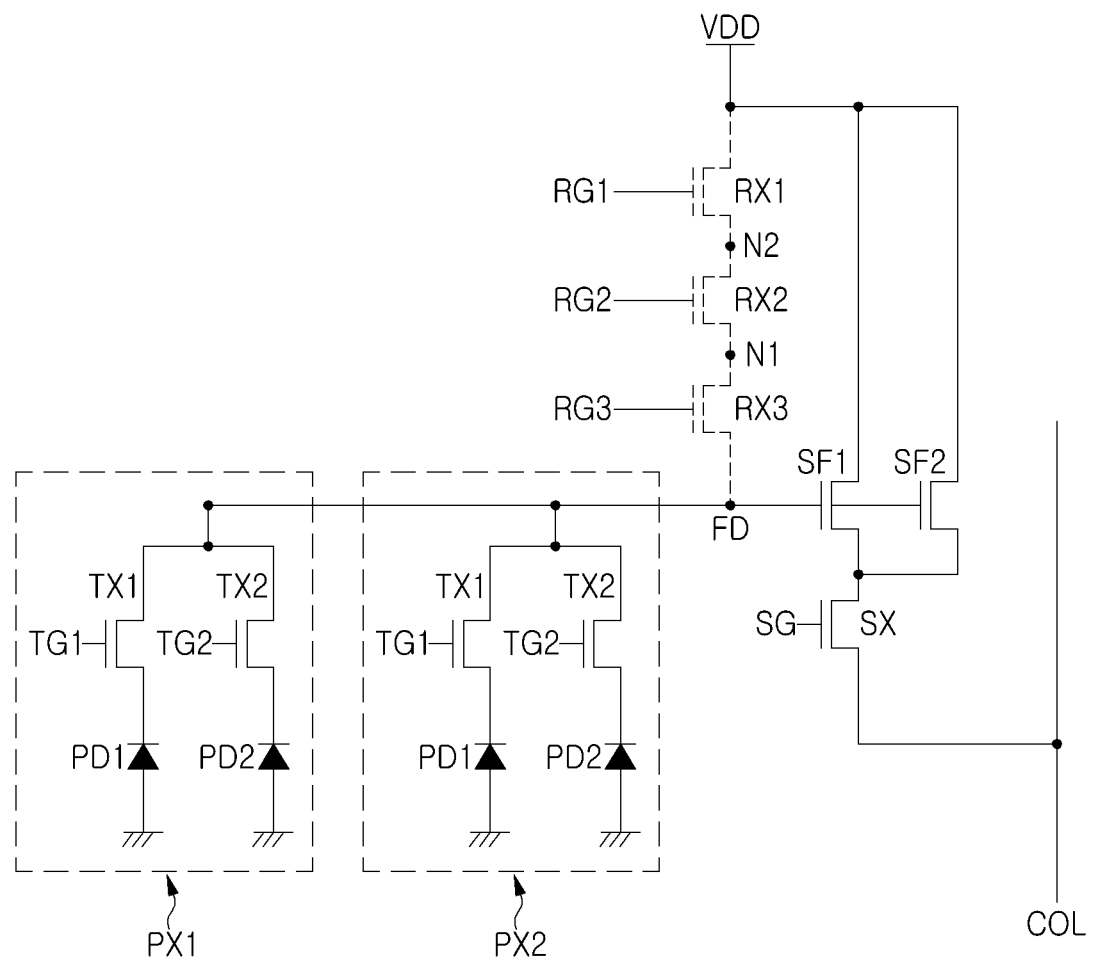
FIGS. 11, 12A, and 12B are diagrams illustrating an operation of an image sensor according to an example embodiment of the present inventive concept.
Figure 12A:
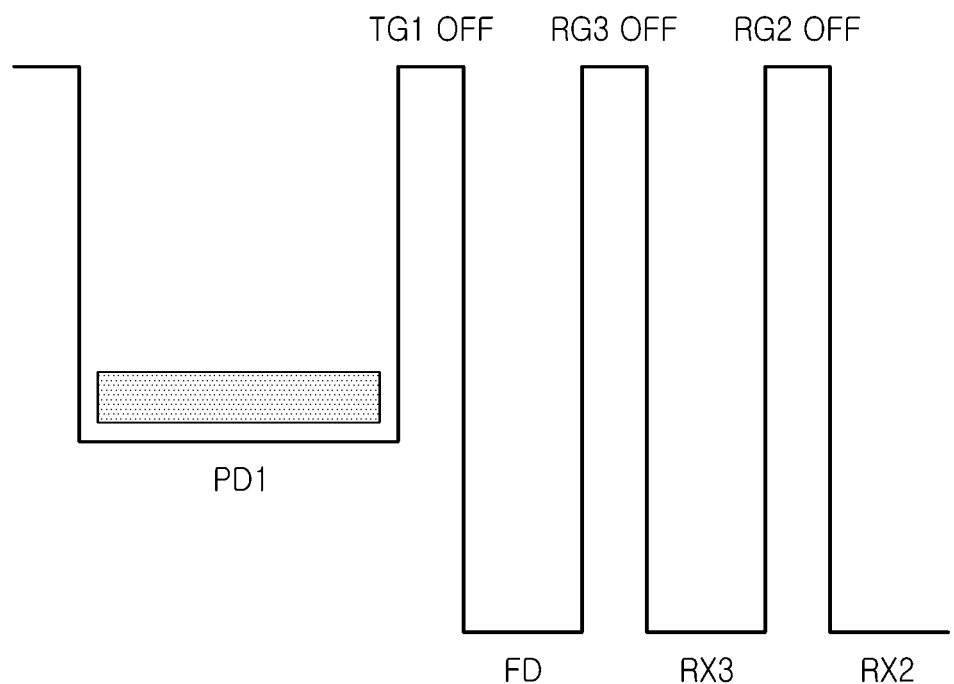
Figure 12B:
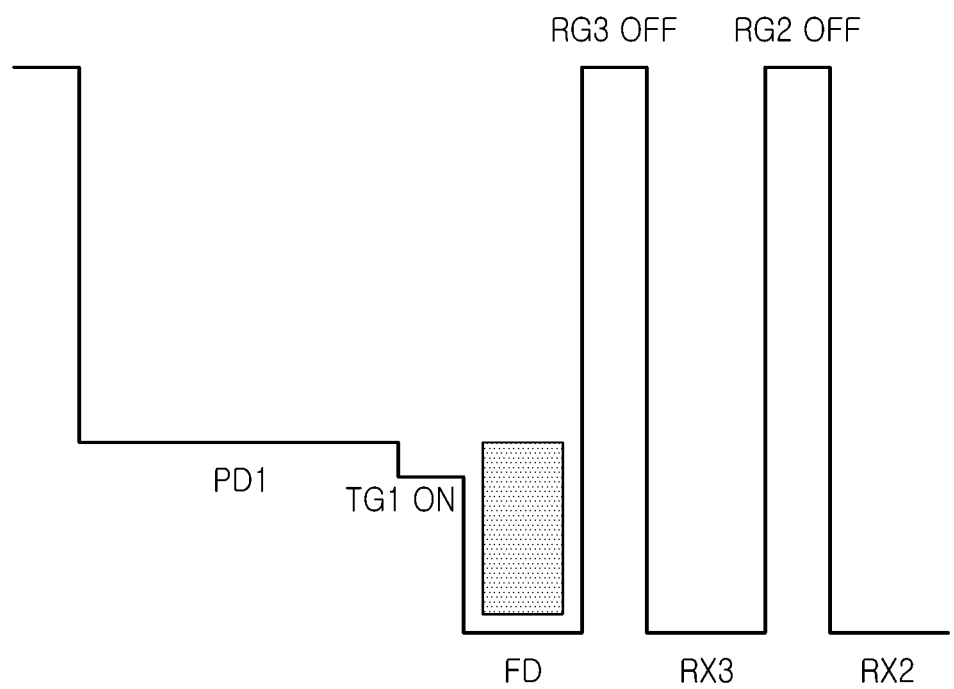

FIGS. 11, 12A, and 12B are diagrams illustrating an operation of an image sensor according to an example embodiment of the present inventive concept.

In the example embodiment illustrated in FIG. 11, both the second reset transistor RX2 and the third reset transistor RX3 may be turned off while a charge generated by each of the photodiodes PD1 and PD2 moves to the floating diffusion region FD. Accordingly, capacitances of the second reset transistor RX2 and the third reset transistor RX3 might not add to a capacitance of the floating diffusion region FD, and a conversion gain of the image sensor may be greater than those of the example embodiments described with reference to FIGS. 7 and 9.

Referring to FIG. 12A, while the first transfer transistor TX1 may be maintained in an OFF state by the first transfer control signal TG1 and the first photodiode PD1 is exposed to light, the second reset transistor RX2 and the third reset transistor RX3 may be turned off, such that the floating diffusion region FD may be isolated from the first node N1 and the second node N2. When the first transfer transistor TX1 is turned on, a charge of the first photodiode PD1 may move to the floating diffusion region FD, as illustrated in FIG. 12B. However, in some example embodiments of the present inventive concept, the second reset transistor RX2 might not be turned off, and the third reset transistor RX3 may be turned off.

Figure 13:
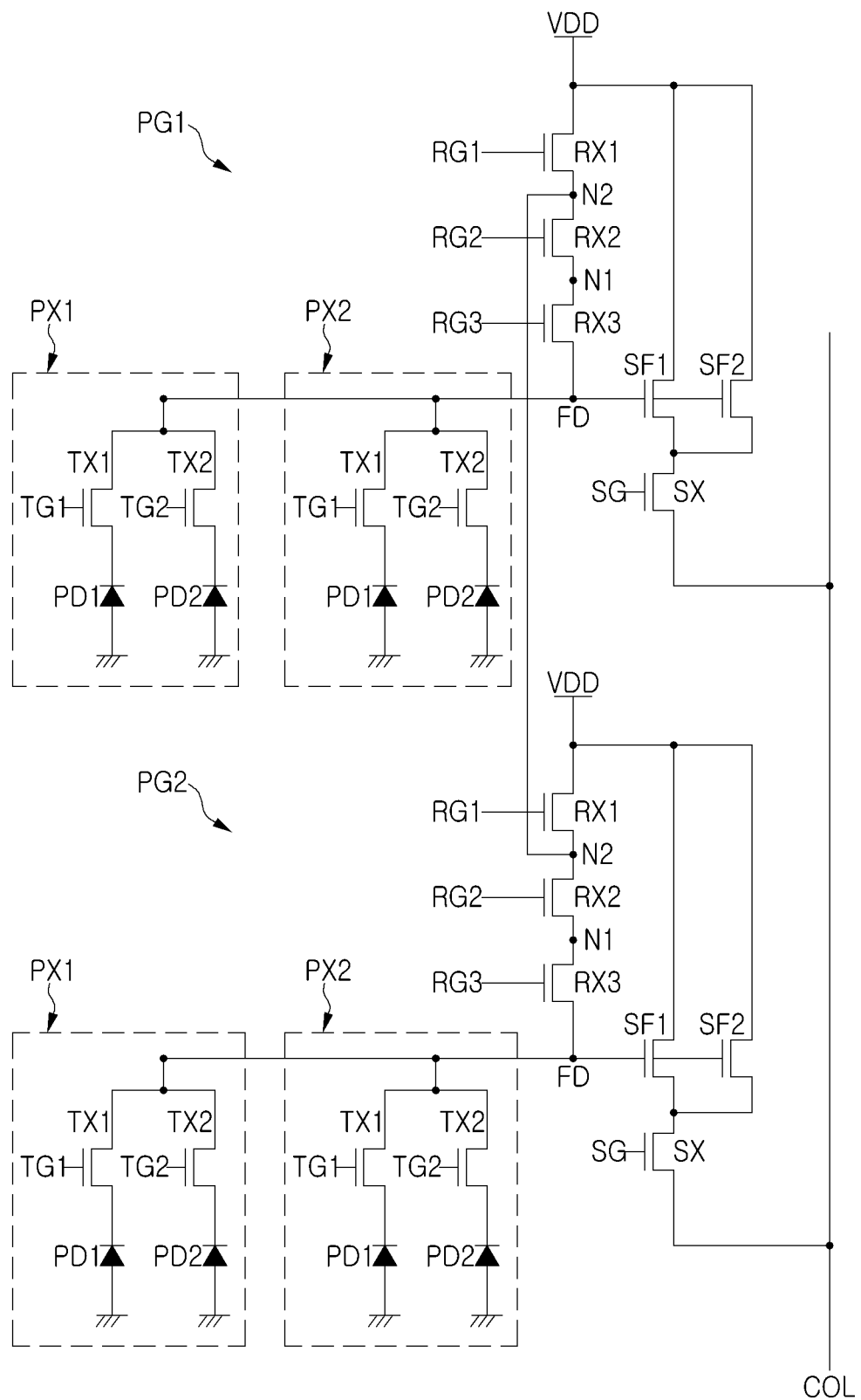
FIG. 13 is a schematic circuit diagram illustrating a pixel of an image sensor according to an example embodiment of the present inventive concept.
Figure 14:
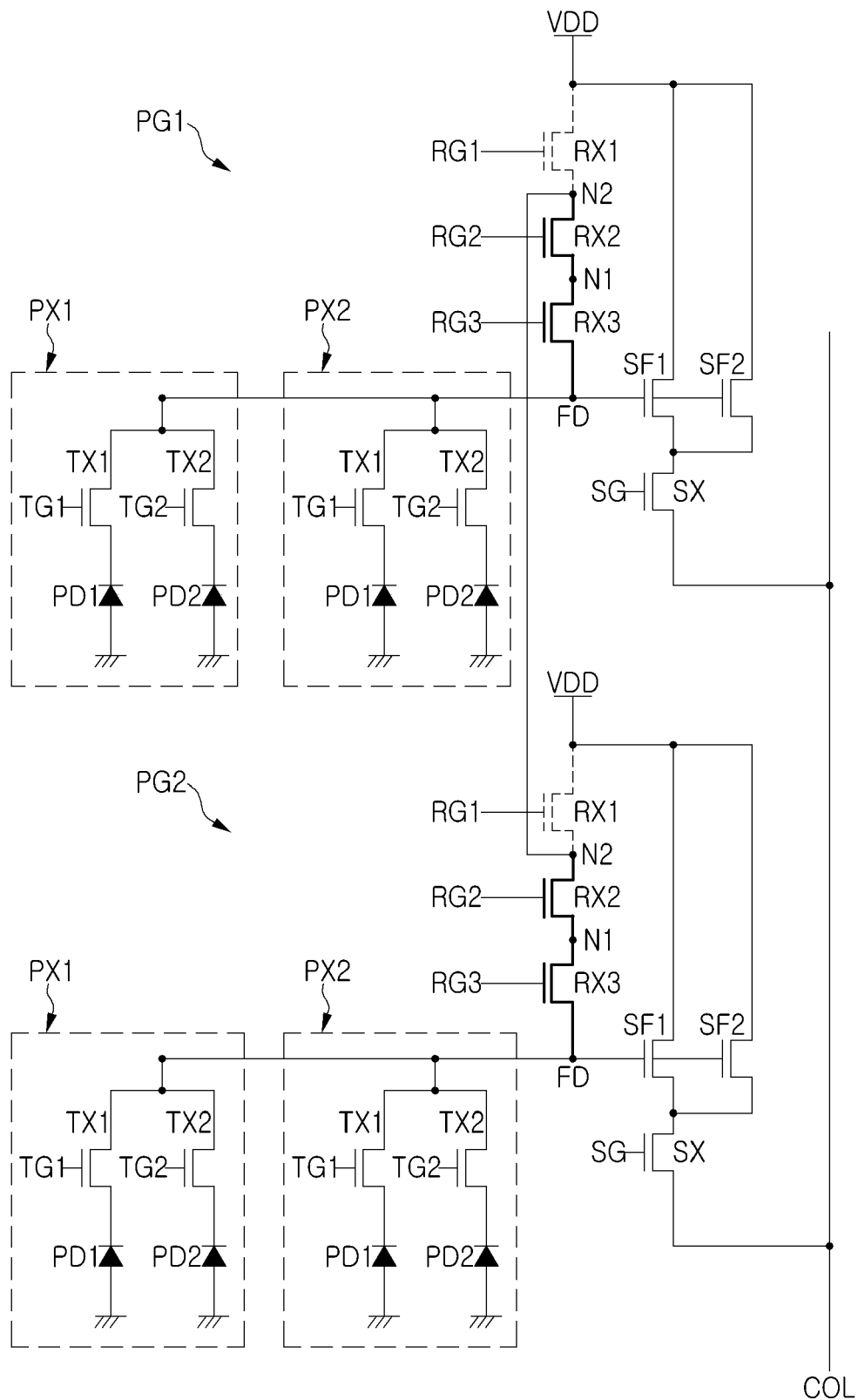
FIGS. 14 and 15 are diagrams illustrating an operation of an image sensor according to an example embodiment of the present inventive concept.
Figure 15:
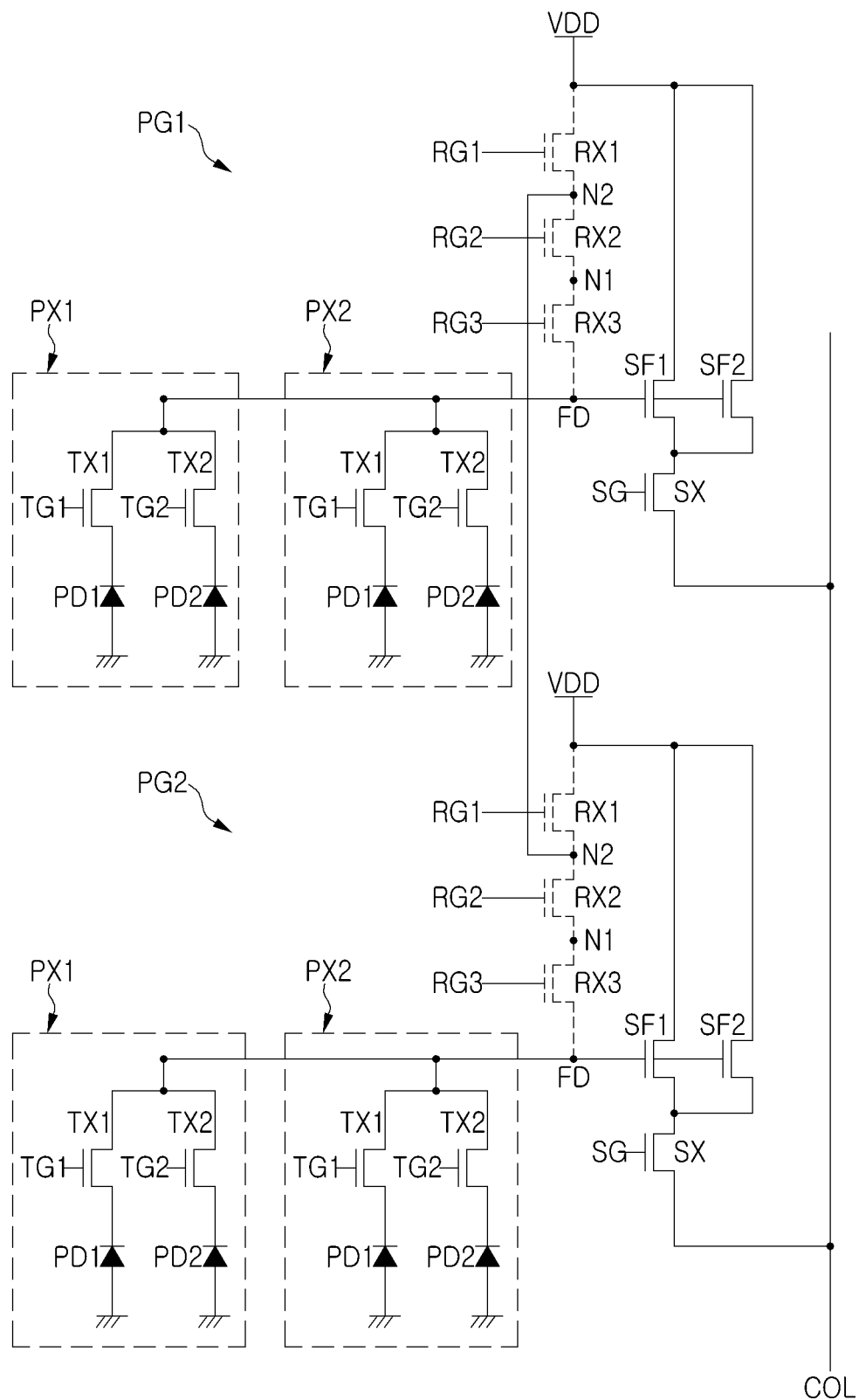

FIG. 13 is a schematic circuit diagram illustrating a pixel of an image sensor according to an example embodiment of the present inventive concept. FIGS. 14 and 15 are diagrams illustrating an operation of an image sensor according to an example embodiment of the present inventive concept.

First, FIG. 13 may be a schematic circuit diagram illustrating a pair of pixel groups PG1 and PG2 adjacent to each other in a pixel array of an image sensor. A pixel circuit of each of the pixel groups PG1 and PG2 adjacent to each other in the pixel array may be configured as described above with reference to FIG. 6.

In an example embodiment of the present inventive concept, one of nodes N1 and N2 between reset transistors RX1 to RX3 included in a first pixel group PG1 may be connected to one of nodes N1 and N2 between reset transistors RX to RX3 included in a second pixel group PG2. For example, referring to FIG. 13, a second node N2 of the first pixel group PG1 may be connected to a second node N2 of the second pixel group PG2. The second node N2 of the first pixel group PG1 may be connected to the second node N2 of the second pixel group PG2 through at least one of interconnection patterns.

A peripheral circuit of the image sensor may change a conversion gain of the image sensor by controlling ON/OFF states of the reset transistors RX1 to RX3 included in each of the first and second pixel groups PG1 and PG2. Hereinafter, an operation of the image sensor will be described with reference to FIGS. 14 and 15 together.

For example, while the peripheral circuit of the image sensor acquires a voltage signal from a first pixel PX1 and a second pixel PX2, which are included in the first pixel group PG1, in a high-illuminance environment (e.g., when external illuminance is higher than a predetermined reference illuminance level), a second reset transistor RX2 and a third reset transistor RX3 may be turned on in each of the first pixel group PG1 and the second pixel group PG2, as illustrated in FIG. 14. For example, in the high-illuminance environment, the first reset transistor RX1 may be turned off in each of the first pixel group PG1 and the second pixel group PG2. In this case, the second reset transistor RX2 and the third reset transistor RX3 of each of the first pixel group PG1 and the second pixel group PG2 and a floating diffusion region FD of the second pixel group PG2 may be connected to a floating diffusion region FD of the first pixel group PG1. Accordingly, a capacitance of the floating diffusion region FD of the first pixel group PG1 may be greatly increased, thereby preventing saturation in a photographing environment in which light is very strong, and increasing maximum brightness expressed by the image sensor.

While the peripheral circuit of the image sensor acquires a voltage signal from the first pixel PX1 and the second pixel PX2 included in the first pixel group PG1 in a low-illuminance environment (e.g., when external illuminance is lower than a predetermined reference illuminance level), the second reset transistor RX2 and the third reset transistor RX3 may be turned off in each of the first pixel group PG1 and the second pixel group PG2, as illustrated in FIG. 15. For example, in the low-illuminance environment, the first reset transistor RX1 may be turned off in each of the first pixel group PG1 and the second pixel group PG2. In this case, a capacitance of the floating diffusion region FD of the first pixel group PG1 may be reduced. Accordingly, the conversion gain of the image sensor may be increased, such that a subject may be accurately expressed and processed even in an environment with a small amount of light.

As described with reference to FIGS. 13 to 15, nodes between reset transistors RX1 to RX3 may be connected to each other in each of the two or more adjacent pixel groups PG1 and PG2, and ON/OFF states of the reset transistors RX1 to RX3 may be controlled depending on an amount of light being introduced to the photodiodes PD1 and PD2, thereby finely adjusting the conversion gain of the image sensor. Accordingly, a dynamic range of the image sensor may be increased.

In addition, active regions formed in each of a pair of adjacent pixels PX1 and PX2 to provide the floating diffusion region FD may be connected to an interconnection pattern. For example, active regions formed in each of a pair of adjacent pixels PX1 and PX2 to provide the floating diffusion region FD may be directly connected to an interconnection pattern. Accordingly, a maximum conversion gain of the image sensor may be increased by reducing a minimum value of capacitance provided by the floating diffusion region FD, and an image output by the image sensor may have increased quality by improving a signal-to-noise ratio in a low-illuminance environment.

FIGS. 16 to 19 are schematic diagrams illustrating a pixel of an image sensor according to an example embodiment of the present inventive concept.

In an image sensor 200 according to an example embodiment of the present inventive concept described with reference to FIGS. 16 to 19, a first pixel PX1 and a second pixel PX2 adjacent to each other in a first direction (Y-axis direction) may form a single pixel group. For example, a charge generated by each of the first pixel PX1 and the second pixel PX2 may be converted to a voltage signal and output to a peripheral circuit by source-follower transistors, which are disposed in the first pixel PX1, and switch transistors that are disposed in the second pixel PX2.

Figure 16:
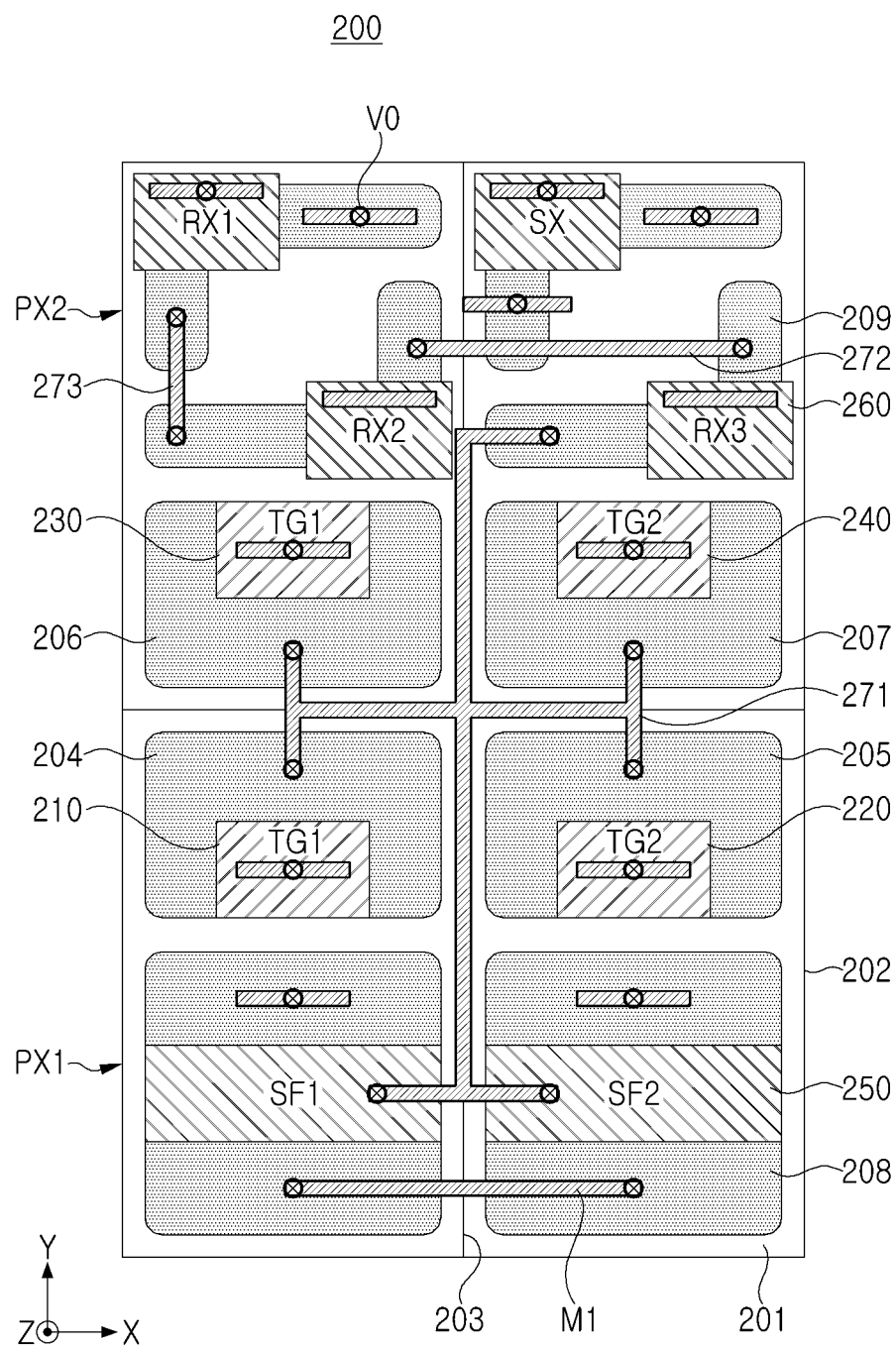
FIGS. 16, 17, 18 and 19 are schematic diagrams illustrating a pixel of an image sensor according to an example embodiment of the present inventive concept.

A structure of each of the first pixel PX1 and the second pixel PX2 may be similar to that in the example embodiment described above with reference to FIG. 3. Referring to FIG. 16, a plurality of pixel regions, in which the first pixel PX1 and the second pixel PX2 are disposed, may be provided by an external pixel isolation film 202. Each of the first pixel PX1 and the second pixel PX2 may include a first photodiode PD1 and a second photodiode PD2 isolated from each other in a second direction (X-axis direction) by an internal pixel isolation film 203.

First transfer gates 210 and 230 and second transfer gates 220 and 240 may be disposed in each of the first pixel PX1 and the second pixel PX2, and the transfer gates 210 to 240 may be adjacent to active regions 204 to 207 in each of the first pixel PX1 and the second pixel PX2. The active regions 204 to 207 may be connected to each other by at least one interconnection pattern 271 among a plurality of first interconnection patterns M1 disposed on a surface of the substrate 201 to provide a floating diffusion region. A capacitance of the floating diffusion region may be determined by a capacitance of each of the active regions 204 to 207 and a capacitance of the interconnection pattern 271 connecting the active regions 204 to 207 to each other.

Transistors disposed in the first pixel PX1 may provide source-follower transistors SF1 and SF2, and may include a gate structure 250 and an active region 208, respectively. Each of transistors disposed in the second pixel PX2 may be a switch transistor operating as a switch, and may include a gate structure 260 and an active region 209. First to third reset transistors RX1 to RX3 and a selection transistor SX may be disposed in the second pixel PX2.

As illustrated in FIG. 16, the plurality of first interconnection patterns M1 may be connected to the transfer gates 210 to 240, the gate structures 250 and 260, and the active regions 204 to 209. For example, the plurality of first interconnection patterns M1 illustrated in FIG. 16 may be a lowermost interconnection pattern disposed on a surface of the substrate 201 on which the transfer gates 210 to 240, the gate structures 250 and 260, and the active regions are formed.

Referring to FIG. 16, the interconnection pattern 271 providing the floating diffusion region may be connected to one of the gate structure 250 of the first pixel PX1 and the active regions 209 of the second pixel PX2 in addition to the active regions 204 to 207 adjacent to the transfer gates 210 to 240. In other words, the interconnection pattern 271 may be connected to the gate structure 250 of each of the source-follower transistors SF1 and SF2, and may also be connected to one of the active regions 209 of the third reset transistor RX3.

As illustrated in FIG. 16, one interconnection pattern 272 of the plurality of first interconnection patterns M1 may provide a first node at which a second reset transistor RX2 and a third reset transistor RX3 are connected to each other. In addition, another interconnection pattern 273 of the plurality of first interconnection patterns M1 may provide a second node at which a first reset transistor RX1 and the second reset transistor RX2 are connected to each other.

Figure 17:
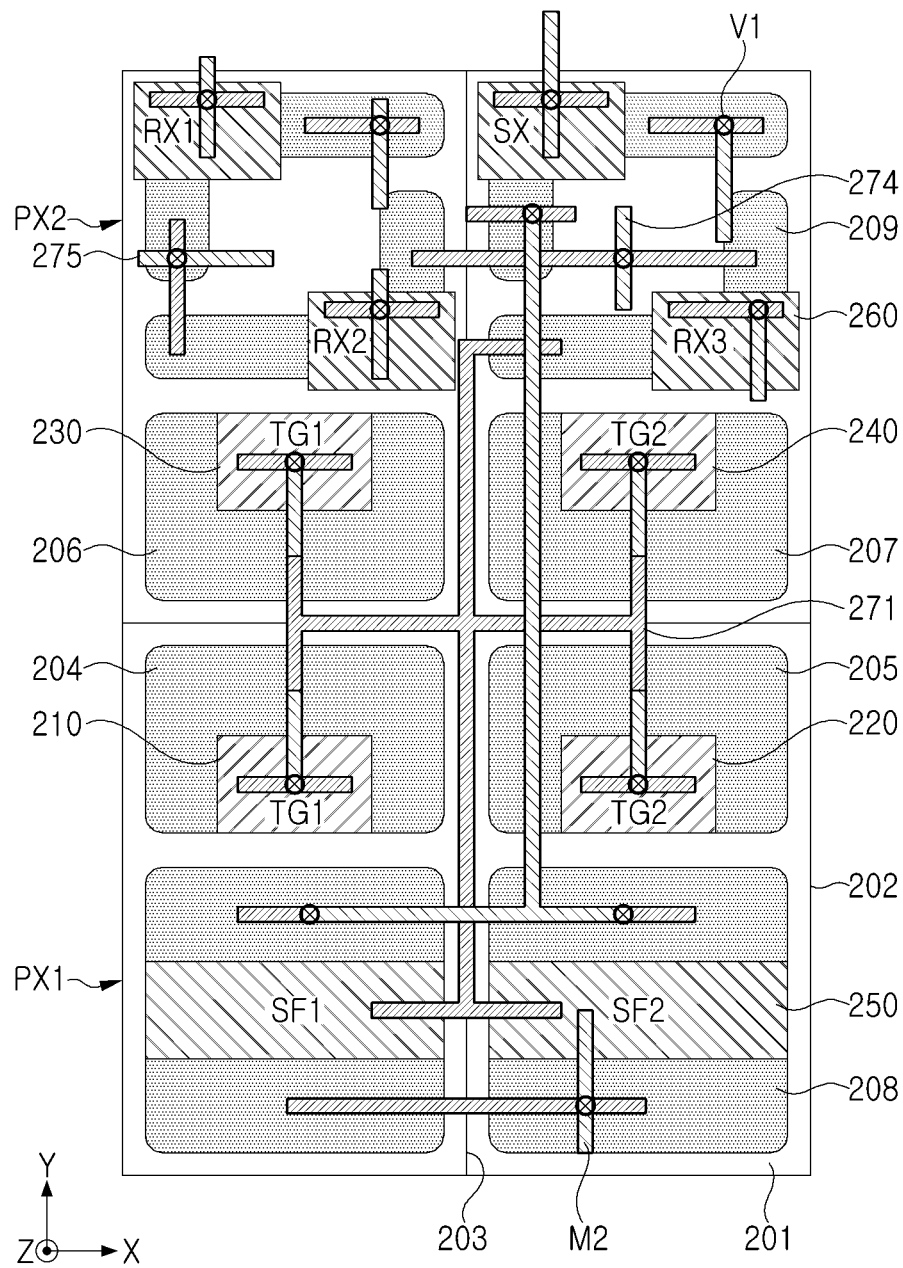
Figure 18:
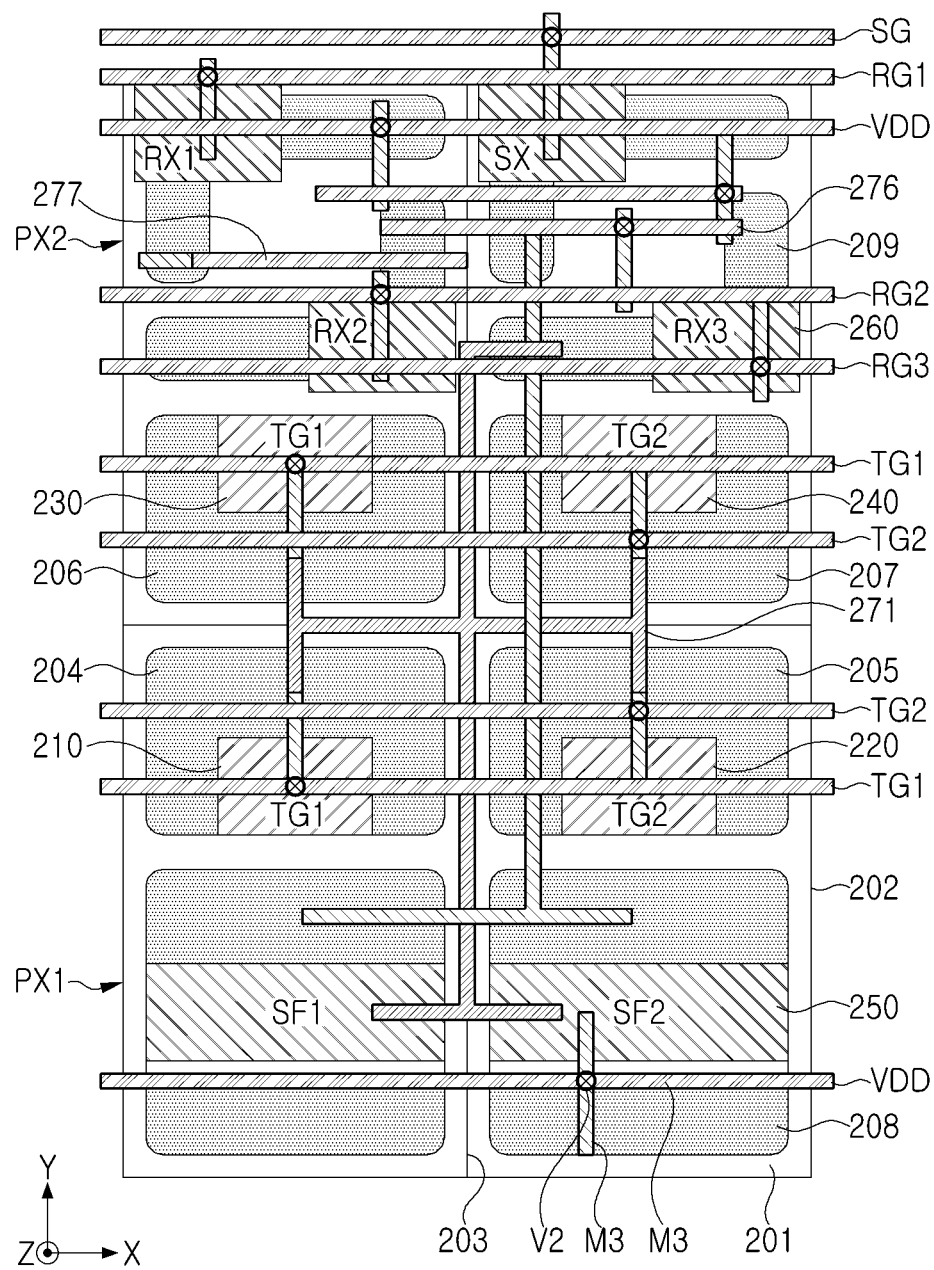
Figure 19:
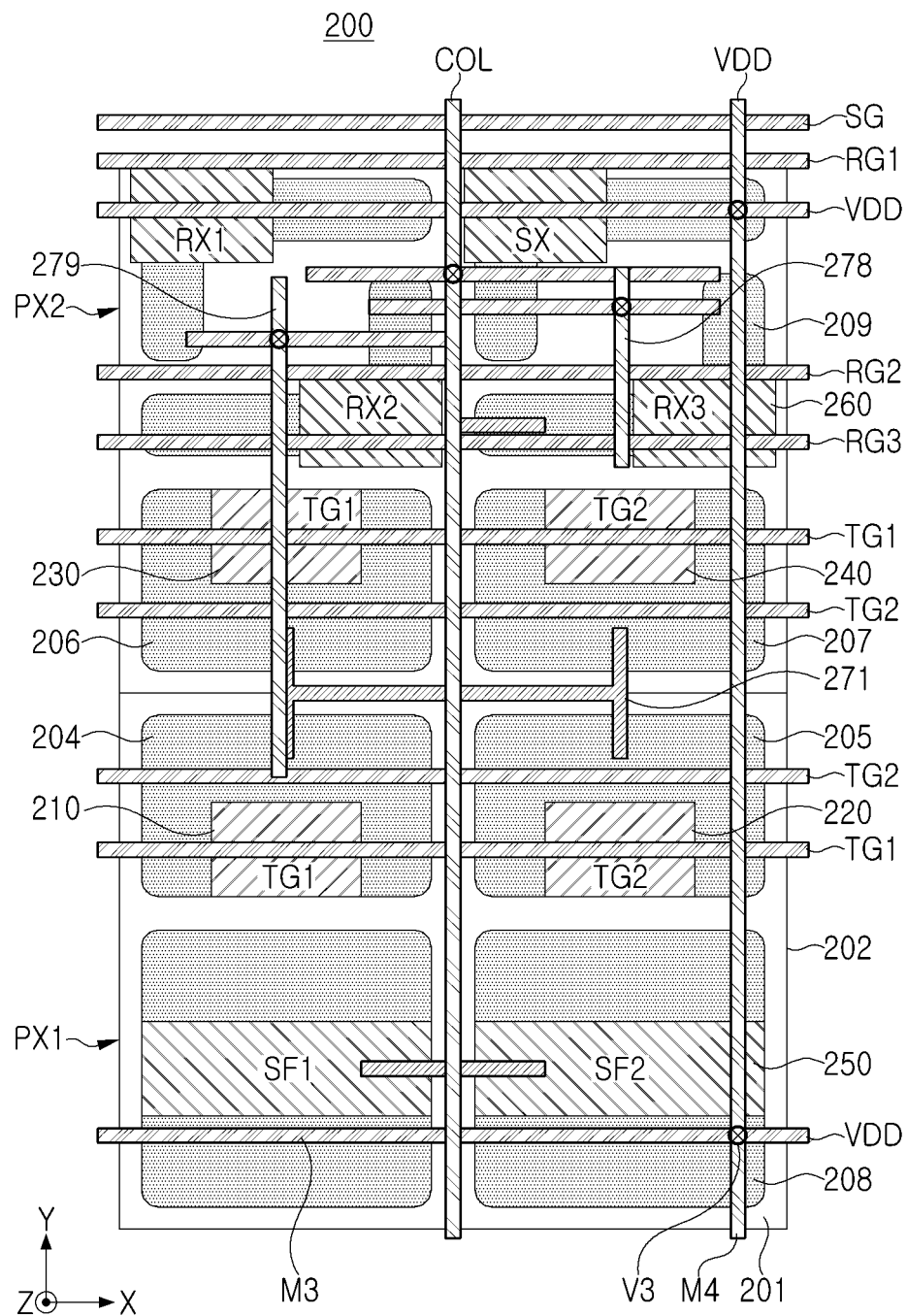

Referring to FIGS. 17 to 19, a plurality of second to fourth interconnection patterns M2 to M4 may be sequentially formed in a third direction (Z-axis direction). Referring to FIG. 17, the plurality of second interconnection patterns M2, connected to at least a portion of the plurality of first interconnection patterns M1 by first vias V1, may be disposed on the plurality of first interconnection patterns M1.

A portion of the plurality of second interconnection patterns M2 may connect a portion of the plurality of first interconnection patterns M1 to each other. For example, in the example embodiment illustrated in FIG. 17, the first interconnection patterns M1 that is connected to the active regions 208 of the source-follower transistors SF1 and SF2 may be connected to the first interconnection pattern M1 that is connected to the active region 209 of the selection transistor SX by one second interconnection pattern M2. One interconnection pattern 274 of the plurality of second interconnection patterns M2 may provide a first node between the second reset transistor RX2 and the third reset transistor RX3, and another interconnection pattern 275 of the plurality of second interconnection patterns M2 may provide a second node between the first reset transistor RX1 and the second reset transistor RX2.

Referring to FIG. 18, a plurality of third interconnection patterns M3, connected to at least a portion of the plurality of second interconnection patterns M2 by second vias V2, may be disposed on the plurality of second interconnection patterns M2. The plurality of third interconnection patterns M3 may extend in the first direction.

At least a portion of the plurality of third interconnection patterns M3 may be provided as row lines connected to row drivers included in a peripheral circuit of the image sensor. For example, referring to FIG. 18, row lines, which transfer a selection control signal SG, reset control signals RG1 to RG3, transfer control signals TG1 and TG2, and power supply voltage VDD to the first pixel PX1 and the second pixel PX2, may be provided by the plurality of third interconnection patterns M3. In addition, one interconnection line 276 of the plurality of third interconnection patterns M3 may provide a first node between the second reset transistor RX2 and the third reset transistor RX3, and another interconnection line 277 of the plurality of third interconnection patterns M3 may provide a second node between the first reset transistor RX1 and the second reset transistor RX2.

Referring to FIG. 19, a plurality of fourth interconnection patterns M4, which is connected to at least a portion of the plurality of third interconnection patterns M3 by a plurality of third vias V3, may be disposed on the plurality of third interconnection patterns M3. The plurality of fourth interconnection patterns M4 may extend in a second direction to intersect the plurality of third interconnection patterns M3.

At least a portion of the plurality of fourth interconnection patterns M4 may be provided as column lines COL that are connected to an ADC circuit included in the peripheral circuit of the image sensor. Referring to FIGS. 16 to 19, the column line COL may be connected to the active region 209 of the selection transistor SX through the first to third vias V1 to V3 and the first to third interconnection patterns M1 to M3.

In addition, at least a portion of the plurality of fourth interconnection patterns M4 may provide a path for inputting the power supply voltage VDD into the pixels PX1 and PX2. In the example embodiment illustrated in FIG. 19, the power supply voltage VDD may be input into the active region 209 of the first reset transistor RX1 and the active regions 208 of the source-follower transistors SF1 and SF2 through the fourth interconnection pattern M4.

One interconnection pattern 278 of the plurality of fourth interconnection patterns M4 may provide a first node between the second reset transistor RX2 and the third reset transistor RX3, and another interconnection pattern 279 of the plurality of fourth interconnection patterns M4 may provide a second node between the first reset transistor RX1 and the second reset transistor RX2. As described with reference to FIG. 13, in some example embodiments of the present inventive concept, at least one of a first node and a second node included in a single pixel group may be connected to at least one of a first node and a second node of another pixel group. Some fourth interconnection patterns 278 and 279 providing the first node and the second node among the plurality of fourth interconnection patterns M4 may be connected to a first node and a second node of another pixel group.

FIGS. 20 to 23 are schematic diagrams illustrating a pixel of an image sensor according to an example embodiment of the present inventive concept.

In the example embodiment illustrated in FIGS. 20 to 23, a layout of at least one of a first pixel PX1 and a second pixel PX2 included in a single pixel group in an image sensor 300 may be different from that of the example embodiment described above with reference to illustrated in FIGS. 16 to 19. Illustratively, a layout of the second pixel PX2 may be different from a layout of the second pixel PX2 in the example embodiment described above with reference to FIGS. 16 to 19.

Figure 20:
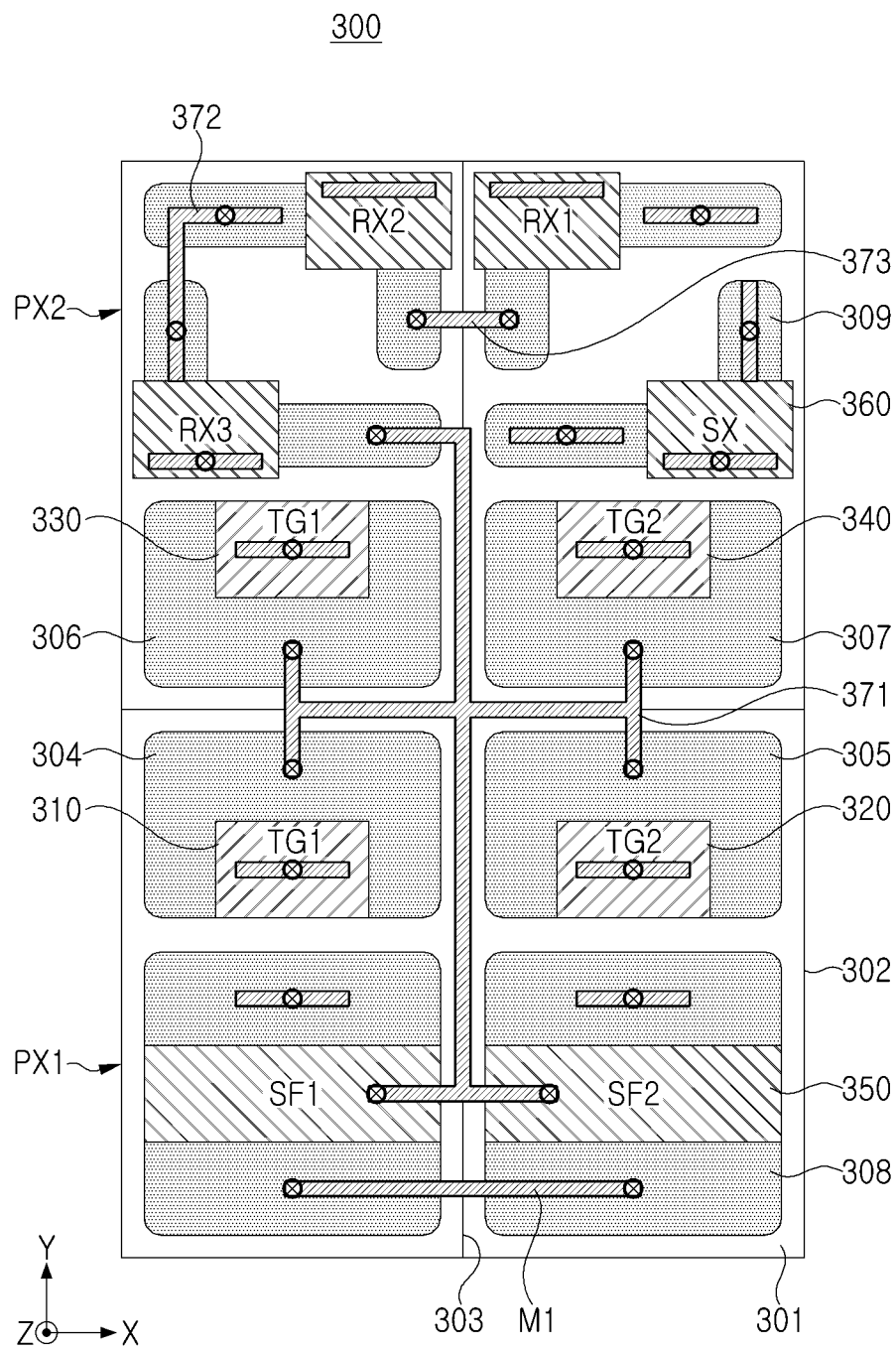
FIGS. 20, 21, 22 and 23 are schematic diagrams illustrating a pixel of an image sensor according to an example embodiment of the present inventive concept.

Referring to FIGS. 20 to 23, arrangements of switch transistors disposed in the second pixel PX2 may be different from each other. Referring to FIG. 20, in the second pixel PX2, a second reset transistor RX2 and a third reset transistor RX3 may be disposed on a left side of an internal pixel isolation film 303, and a first reset transistor RX1 and a selection transistor SX may be disposed on a right side of the internal pixel isolation film 303. Accordingly, as illustrated in FIGS. 20 to 23, shapes and arrangements of a plurality of interconnection patterns M1 to M4 may also be different from those in the example embodiment described above with reference to FIGS. 16 to 19.

Referring to FIG. 20, first transfer gates 310 and 330 and second transfer gates 320 and 340 may be disposed in each of the first pixel PX1 and the second pixel PX2, and the transfer gates 310 to 340 may be adjacent to active regions 304 to 307 in the first pixel PX1 and the second pixel PX2. The active regions 304 to 307 may be connected to each other by at least one interconnection pattern 371, among the first interconnection patterns M1 disposed to be closest to a surface of the substrate 301 among the plurality of interconnection patterns M1 to M4, to provide a floating diffusion region. Accordingly, a capacitance of the floating diffusion region may be determined as a sum of capacitances of the active regions 304 to 307 and a capacitance of the interconnection pattern 371. Each of the plurality of first interconnection patterns M1 may be connected to at least one of the transfer gates 310 to 340, active regions 304 to 309, and gate structures 350 and 360 by a contact via V0.

In addition, by the at least one interconnection pattern 371, the floating diffusion region may be connected to one of the active regions 309 of the third reset transistor RX3 and the gate structure 350 of each of the source-follower transistors SF1 and SF2. In addition, one interconnection pattern 372 of the plurality of first interconnection patterns M1 may provide a first node at which the second reset transistor RX2 and the third reset transistor RX3 are connected to each other, and another interconnection pattern 373 of the plurality of first interconnection patterns M1 may provide a second node at which the first reset transistor RX1 and the second reset transistor RX2 are connected to each other.

Figure 21:
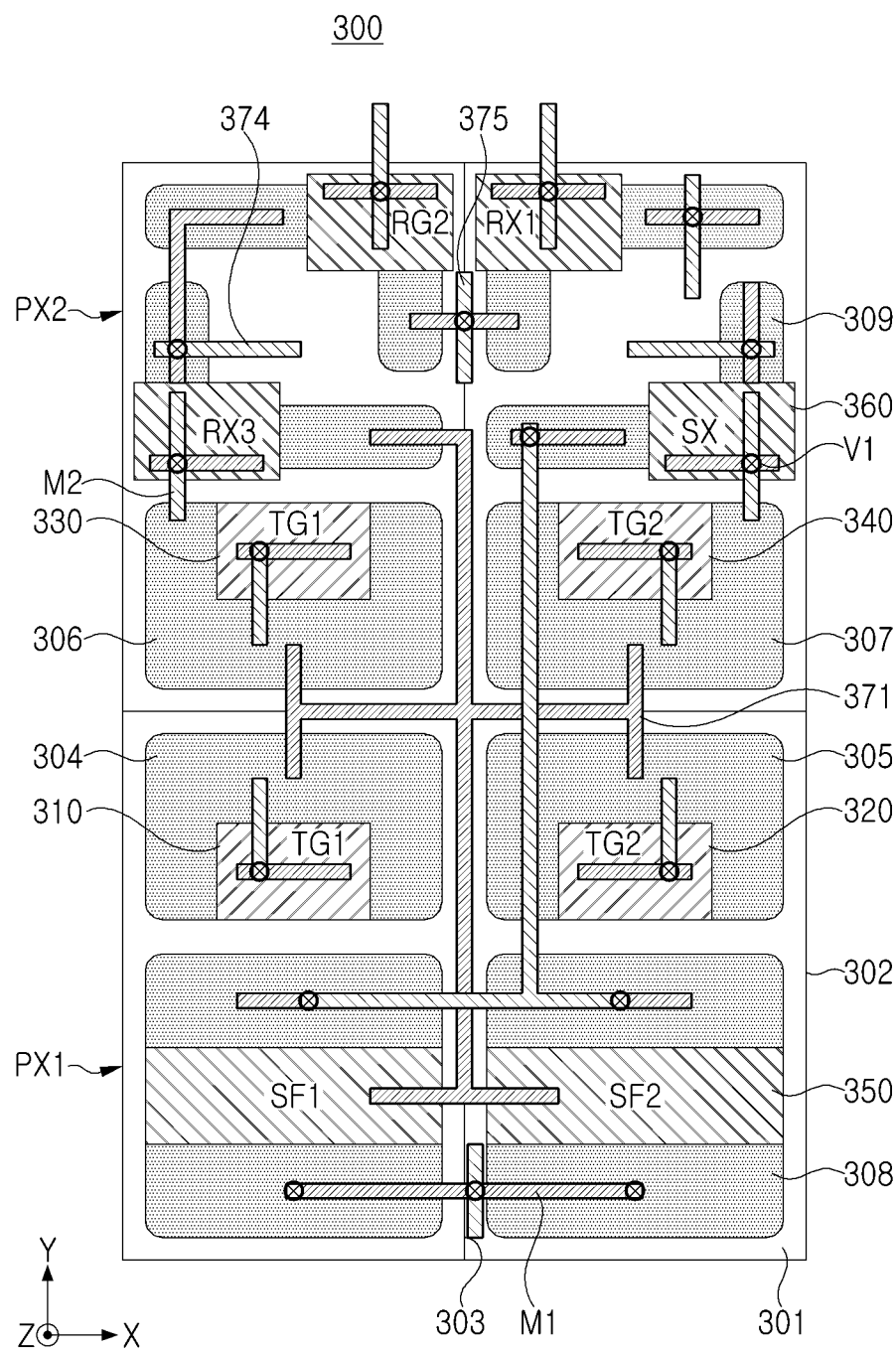

Referring to FIG. 21, a plurality of second interconnection patterns M2 may be disposed on the plurality of first interconnection patterns M1 in a third direction (Z-axis direction). Each of the plurality of second interconnection patterns M2 may be connected to at least one of the plurality of first interconnection patterns M1 through a first via V1. For example, one interconnection pattern 374 of the plurality of second interconnection patterns M2 may provide a first node, and the another interconnection pattern 375 of the plurality of second interconnection patterns M2 may provide a second node.

Figure 22:
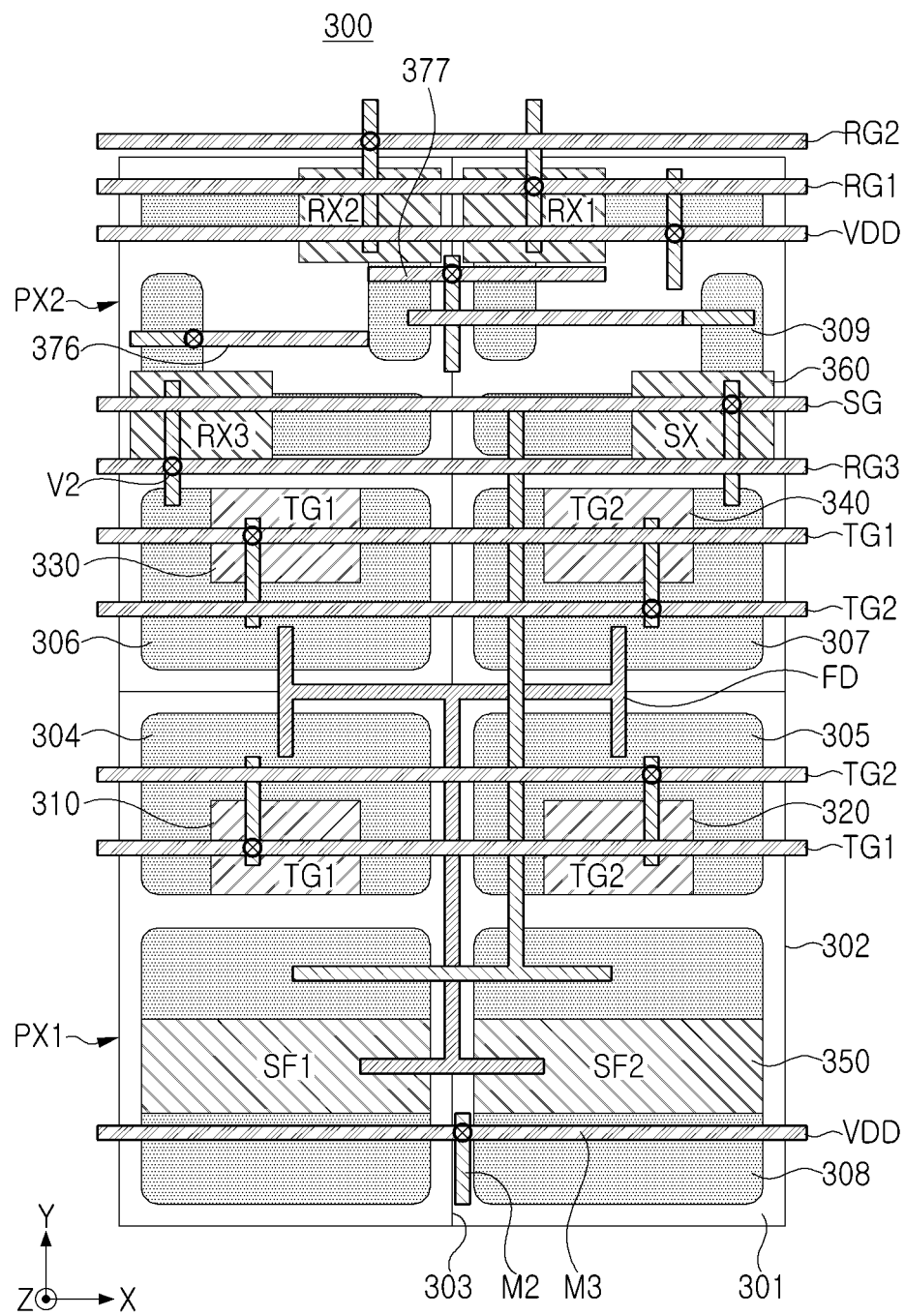

Referring to FIG. 22, a plurality of third interconnection patterns M3 may be disposed on the plurality of second interconnection patterns M2 in the third direction. Each of the plurality of third interconnection patterns M3 may be connected to at least one of the plurality of second interconnection patterns M2 through a second via V2. For example, one interconnection pattern 376 of the plurality of third interconnection patterns M3 may provide a first node, and another interconnection pattern 377 of the plurality of third interconnection patterns M3 may provide a second node.

At least a portion of the plurality of third interconnection patterns M3 may extend in a second direction (X-axis direction). A portion of the third interconnection patterns M3 extending in the second direction may be connected to a peripheral circuit of the image sensor 300, and may provide transfer paths for transfer control signals TG1 and TG2 that are input into the transfer gates 310 to 340, reset control signals RG1 to RG3 that are input into the gate structures 350 and 360, and a selection control signal SG that is input into the selection transistor SX. In addition, another portion of the third interconnection patterns M3 extending in the second direction may provide a transfer path for a power voltage VDD.

Figure 23:
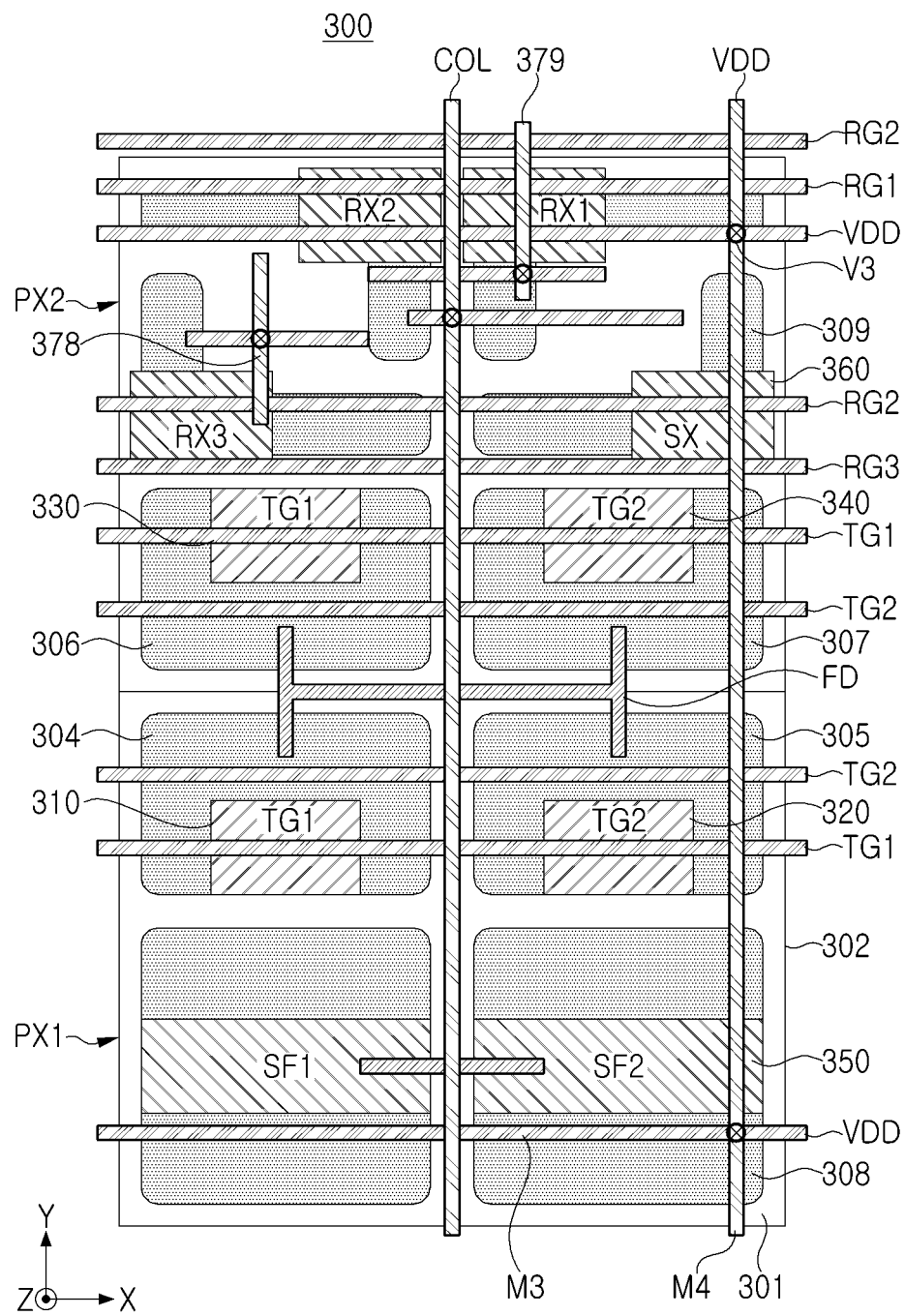

Referring to FIG. 23, a plurality of fourth interconnection patterns M4 may be disposed on the plurality of third interconnection patterns M3 in the third direction. Each of the plurality of fourth interconnection patterns M4 may be connected to at least one of the plurality of third interconnection patterns M3 through a third via V3. For example, one interconnection pattern 378 of the plurality of fourth interconnection patterns M4 may provide a first node, and another interconnection pattern 379 of the plurality of fourth interconnection patterns M4 may provide a second node. At least one of some fourth interconnection patterns 378 and 379 respectively providing the first node and the second node may extend in a first direction (Y-axis direction) to be connected to a first node and a second node of another pixel group.

At least a portion of the plurality of fourth interconnection patterns M4 may extend in the first direction to be connected to the peripheral circuit of the image sensor 300. For example, at least one of the plurality of fourth interconnection patterns M4 that is connected to the selection transistor SX may be provided as a column line COL that is connected to an ADC circuit of the image sensor 300 to output a voltage signal.

Figure 24:
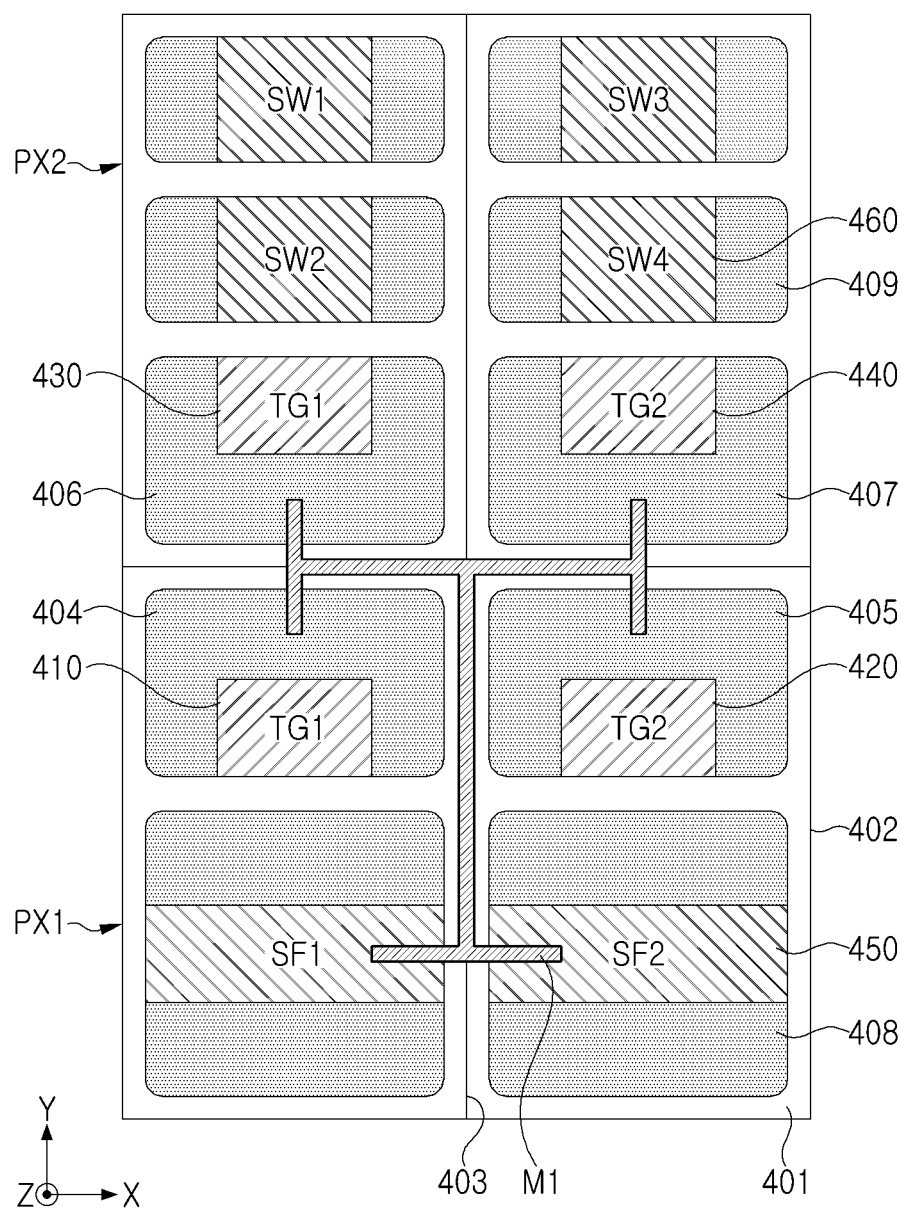
FIGS. 24 and 25 are schematic diagrams illustrating a pixel of an image sensor according to example embodiments of the present inventive concept.
Figure 25:
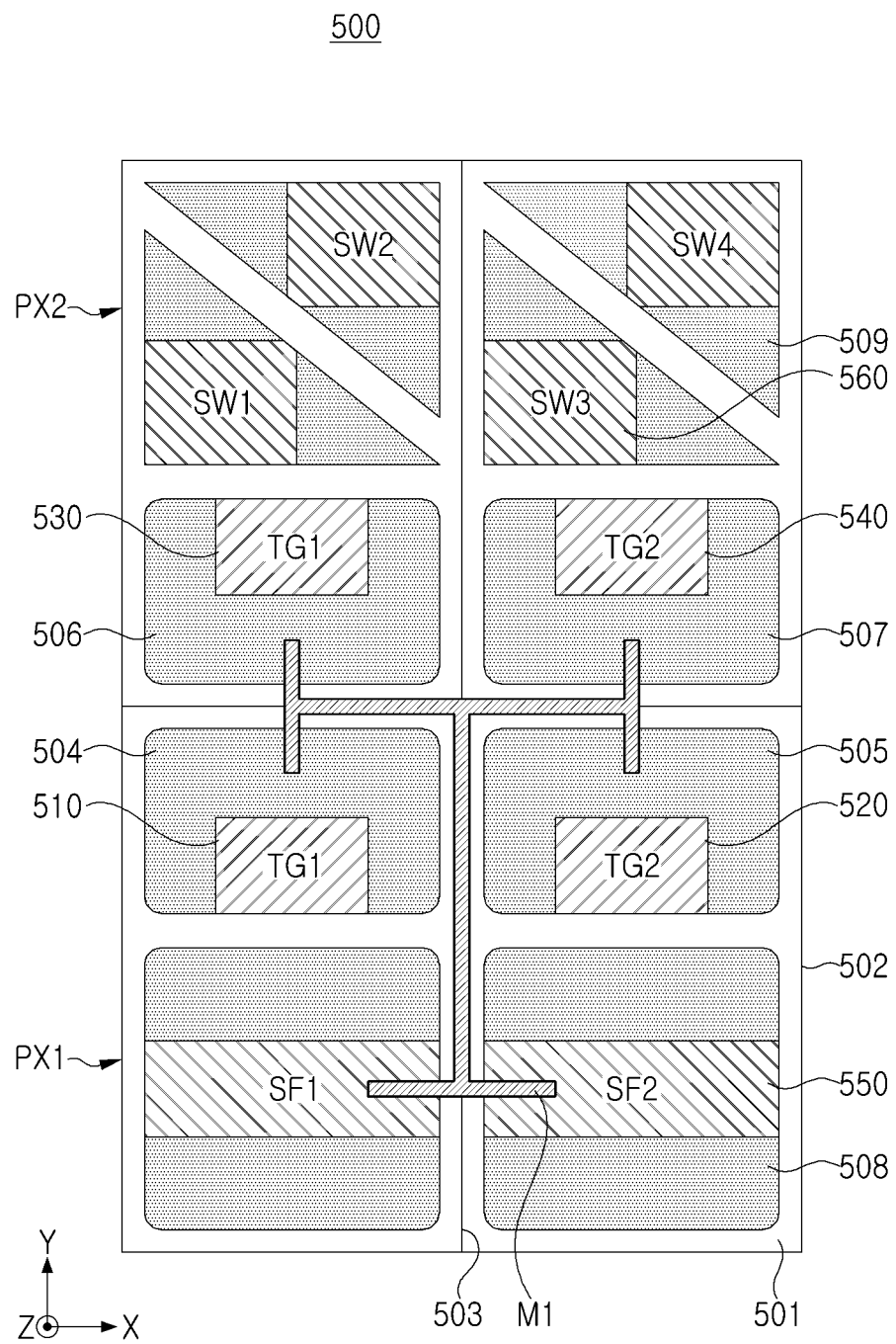

FIGS. 24 and 25 are schematic diagrams illustrating a pixel of an image sensor according to example embodiments of the present inventive concept.

Referring to FIG. 24, a single pixel group disposed in the image sensor 400 may include a first pixel PX1 and a second pixel PX2 adjacent to each other in a first direction (Y-axis direction). The first pixel PX1 and the second pixel PX2 may be isolated from each other by an external pixel isolation film 402 formed on a substrate 401, and each of the first pixel PX1 and the second pixel PX2 may include a first photodiode and a second photodiode adjacent to each other in a second direction (X-axis direction). The first photodiode and the second photodiode may be disposed between the external pixel isolation film 402 and an internal pixel isolation film 403.

A first transfer gate 410 and a second transfer gate 420, and source-follower transistors SF1 and SF2 may be disposed in the first pixel PX1. A first transfer gate 430 and a second transfer gate 440, and a plurality of switch transistors SW1 to SW4 may be disposed in the second pixel PX2. The transfer gates 410 to 440 may be adjacent to active regions 404 to 407, respectively, and the active regions 404 to 407 may be connected to each other by a first interconnection pattern M1 to provide a floating diffusion region.

Each of the source-follower transistors SF1 and SF2 may include a gate structure 450 and an active region 408, and each of the plurality of switch transistors SW1 to SW4 may include a gate structure 460 and an active region 409. The plurality of switch transistors SW1 to SW4 may provide elements to implement a pixel circuit, for example, a plurality of reset transistors and at least one selection transistor.

In the example embodiment illustrated in FIG. 24, in each of the plurality of switch transistors SW1 to SW4, an active region 409 may be disposed on opposite sides of the gate structure 460 in the second direction. In addition, in each of the source-follower transistors SF1 and SF2, the active region 408 may be disposed on opposite sides of the gate structure 450 in the first direction. An area of each of the plurality of switch transistors SW1 to SW4 may be smaller than that of each of the source-follower transistors SF1 and SF2 that are operating as an amplifier.

As described above, the area of each of the plurality of switch transistors SW1 to SW4 may be reduced and arranged in a region of one pixel corresponding to the second pixel PX2, transistors to implement the pixel circuit may be formed in a pair of pixels PX1 and PX2, thereby reducing a length of the interconnection pattern M1 connecting, to each other, the active regions 404 to 407 that provide the floating diffusion region, lowering a capacitance of the floating diffusion region to increase a conversion gain of the image sensor 400, and increase performance of the image sensor 400 in a low-illuminance environment.

Referring to FIG. 25, a single pixel group disposed in an image sensor 500 may include a first pixel PX1 and a second pixel PX2 adjacent to each other in a first direction (Y-axis direction). Each of the first pixel PX1 and the second pixel PX2 may include a first photodiode and a second photodiode disposed between an external pixel isolation film 502 and an internal pixel isolation film 503 formed on a substrate 501.

A first transfer gate 510 and a second transfer gate 520, and source-follower transistors SF1 and SF2 may be disposed in the first pixel PX1. A first transfer gate 530 and a second transfer gate 540 and a plurality of switch transistors SW1 to SW4 may be disposed in the second pixel PX2. Active regions 504 to 507 adjacent to the transfer gates 510 to 540 may be connected to each other by a first interconnection pattern M1 to provide a floating diffusion region.

Each of the source-follower transistors SF1 and SF2 may include a gate structure 550 and an active region 508, and each of the plurality of switch transistors SW1 to SW4 may include a gate structure 560 and an active region 509. The plurality of switch transistors SW1 to SW4 may provide a plurality of reset transistors and at least one selection transistor.

In the example embodiment illustrated in FIG. 25, the active regions 509 included in each of the plurality of switch transistors SW1 to SW4 may be disposed in a diagonal direction. The diagonal direction may be a direction, parallel to a surface of the substrate 501, and may be a direction different from first and second directions. For example, the diagonal direction may cross the first and second directions. For example, in each of the plurality of switch transistors SW1 to SW4, the active regions 509 may be disposed in a first diagonal direction. In each of the plurality of switch transistors SW1 to SW4, the active regions 509 may be adjacent to the gate structure 560 in the first and second directions. For example, a first active region of the active regions 509 may be adjacent to a first side, extending in the second direction, of the gate structure 560, and a second active region of the active regions 509 may be adjacent to a second side, extending in the first direction, of the gate structure 560.

In an example embodiment of the present inventive concept, the gate structures 560 of the plurality of switch transistors SW1 to SW4 face each other in a second diagonal direction crossing the first diagonal direction. For example, a gate structure 560 of the first switch transistor SW1 faces a gate structure 560 of the second switch transistor SW2 in the second diagonal direction.

In some example embodiments of the present inventive concept, in at least one of the plurality of switch transistors SW1 to SW4, the active regions 509 may be arranged in a second diagonal direction, different from the first diagonal direction. For example, in each of first and second switch transistors SW1 and SW2 that are disposed on a left side of the internal pixel isolation film 503, the active regions 509 may be arranged in the first diagonal direction, and in each of third and fourth switch transistors SW3 and SW4 that are disposed on a right side of the internal pixel isolation film 503, the active regions 509 may be arranged in the second diagonal direction, intersecting the first diagonal direction. In this case, the first and second switch transistors SW1 and SW2 and the third and fourth switch transistors SW3 and SW4 may be disposed to be symmetrical with respect to the internal pixel isolation film 503.

FIGS. 26 to 30 are schematic diagrams illustrating a pixel of an image sensor according to an example embodiment of the present inventive concept.

Figure 26:
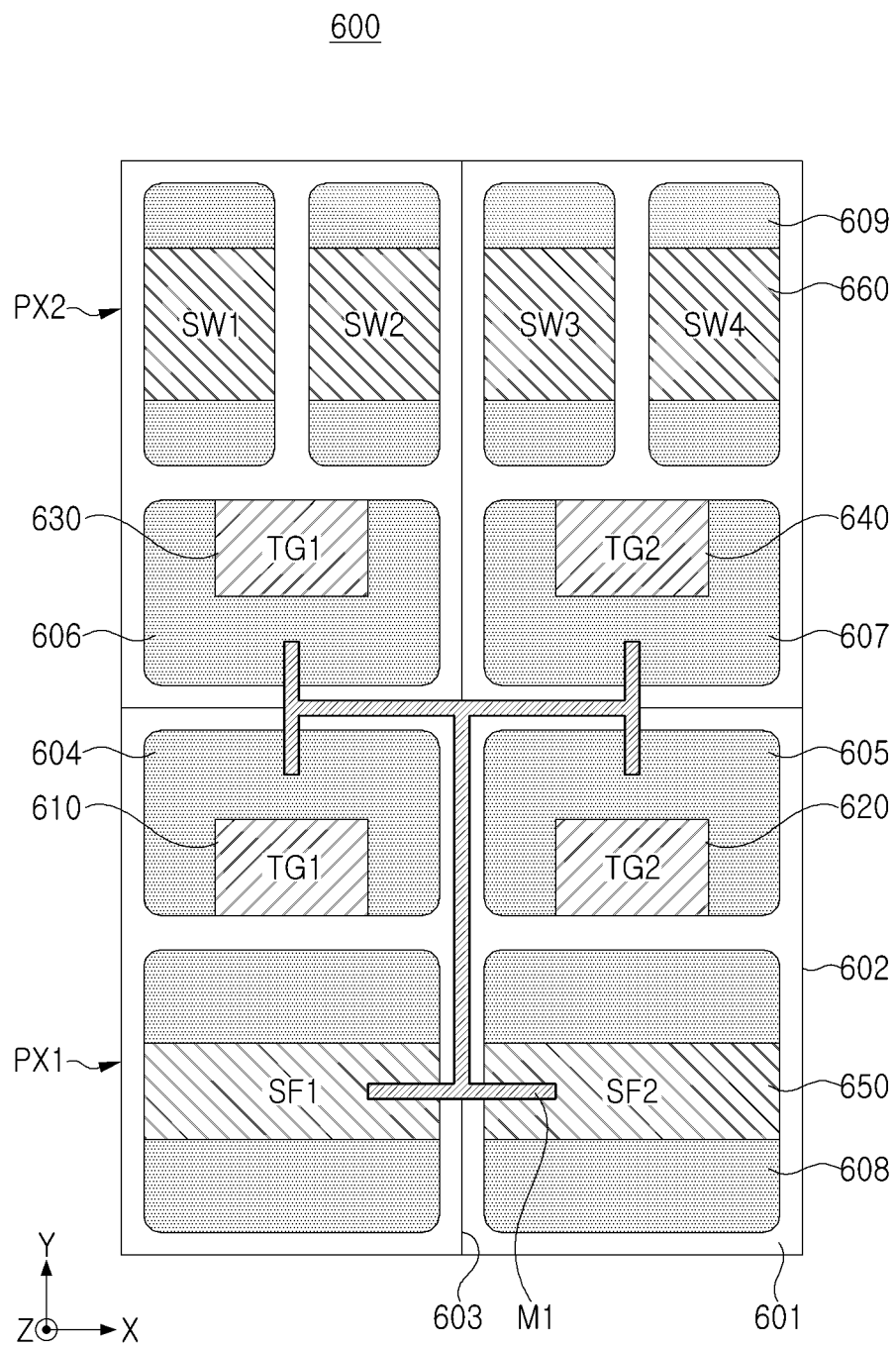
FIGS. 26, 27, 28, 29 and 30 are schematic diagrams illustrating a pixel of an image sensor according to an example embodiment of the present inventive concept.

Referring first to FIG. 26, a single pixel group disposed on an image sensor 600 may include a first pixel PX1 and a second pixel PX2 adjacent to each other in a first direction (Y-axis direction). The first pixel PX1 and the second pixel PX2 may be disposed between an external pixel isolation film 602 and an internal pixel isolation film 603 formed on a substrate 601, and accordingly, each of the first pixel PX1 and the second pixel PX2 may include a first photodiode and a second photodiode arranged in a second direction (X-axis direction).

A first transfer gate 610 and a second transfer gate 620, and source-follower transistors SF1 and SF2 may be disposed in the first pixel PX1. A first transfer gate 630 and a second transfer gate 640, and a plurality of switch transistors SW1 to SW4 may be disposed in the second pixel PX2. In each of the first pixel PX1 and the second pixel PX2, the first transfer gates 610 and 630 may be adjacent to the first photodiode, and the second transfer gates 620 and 640 may be adjacent to the second photodiode. The transfer gates 610 to 640 may be adjacent to active regions 604 to 607, respectively, and the active regions 604 to 607 may be connected to each other by a first interconnection pattern M1 to provide a floating diffusion region.

Each of the source-follower transistors SF1 and SF2 may include a gate structure 650 and an active region 608, and each of the plurality of switch transistors SW1 to SW4 may include a gate structure 660 and an active region 609. The plurality of switch transistors SW1 to SW4 may provide elements for implementing a pixel circuit, for example, a plurality of reset transistors and at least one selection transistor. For example, first to third switch transistors SW1 to SW3 may correspond to first to third reset transistors, and a fourth switch transistor SW4 may be a selection transistor.

In the example embodiment illustrated in FIG. 26, in each of the plurality of switch transistors SW1 to SW4, the active region 609 may be disposed on opposite sides of the gate structure 660 in the first direction. In each of the source-follower transistors SF1 and SF2, the active region 608 may be disposed on opposite sides of the gate structure 650 in the second direction. An area of each of the plurality of switch transistors SW1 to SW4 may be smaller than that of each of the source-follower transistors SF1 and SF2 that are operating as an amplifier. Accordingly, the number of switch transistors SW1 to SW4 may be greater than the number of source-follower transistors SF1 and SF2.

Figure 27:
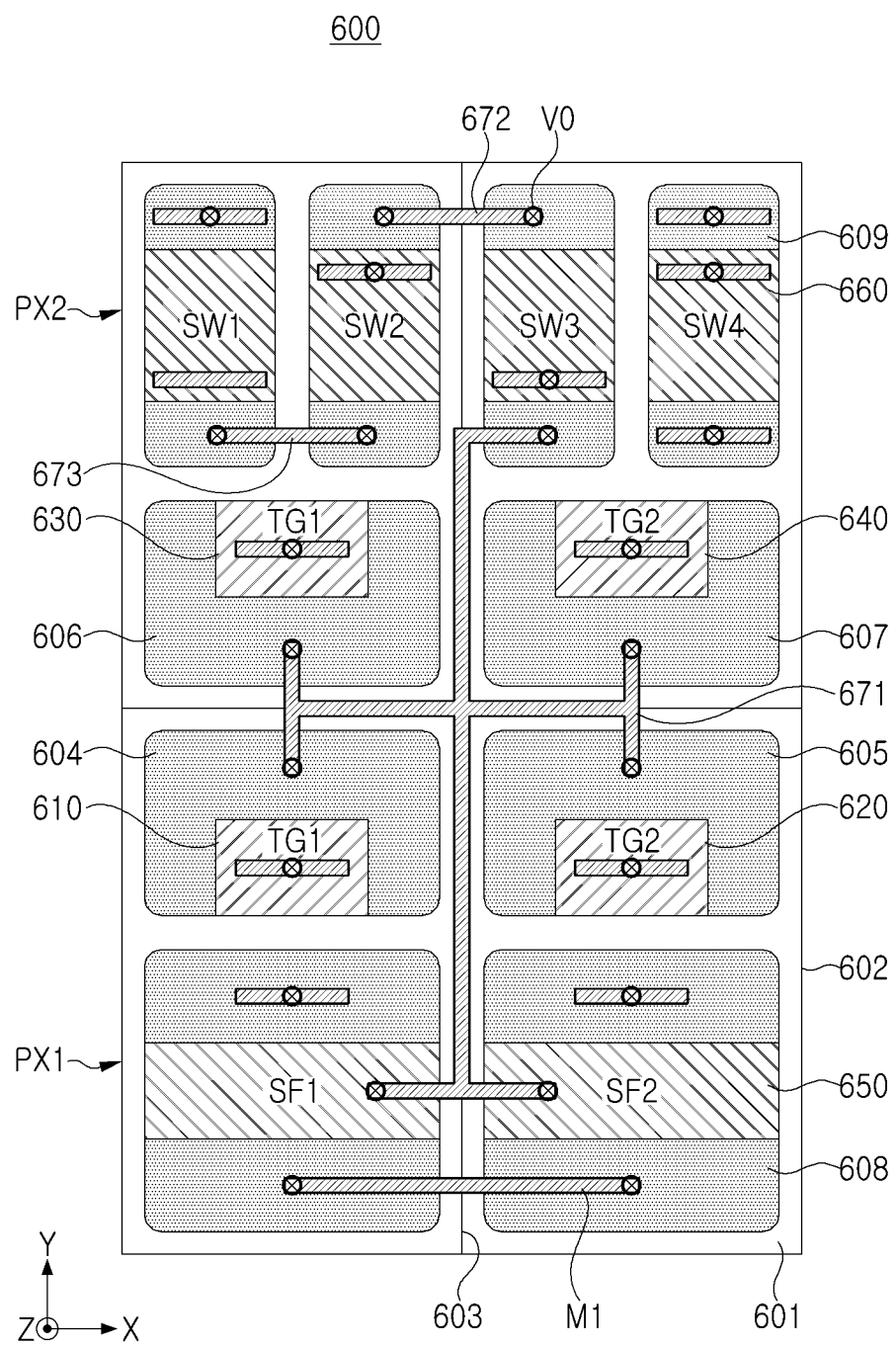

As illustrated in FIG. 27, a plurality of first interconnection patterns M1 may be connected to the transfer gates 610 to 640, gate structures 650 and 660, and active regions 604 to 609. Referring to FIG. 27, an interconnection pattern 671 may connect active regions 604 to 607 that are adjacent to transfer gates 610 to 640 to each other to provide the floating diffusion region, and may be connected to the gate structure 650 of each of the source-follower transistors SF1 and SF2 and the active region 609 of the third switch transistor SW3. Accordingly, the floating diffusion region may be connected to the third reset transistor and the source-follower transistors SF1 and SF2 by the interconnection pattern 671.

Referring to FIG. 27, one interconnection pattern 672 of the plurality of first interconnection patterns M1 may connect the second and third switch transistors SW2 and SW3 to each other to provide a first node at which the second reset transistor and the third reset transistor are connected to each other. In addition, another interconnection pattern 673 of the plurality of first interconnection patterns M1 may connect the first and second switch transistors SW1 and SW2 to each other to provide a second node at which the first reset transistor and the second reset transistor are connected to each other.

Figure 28:
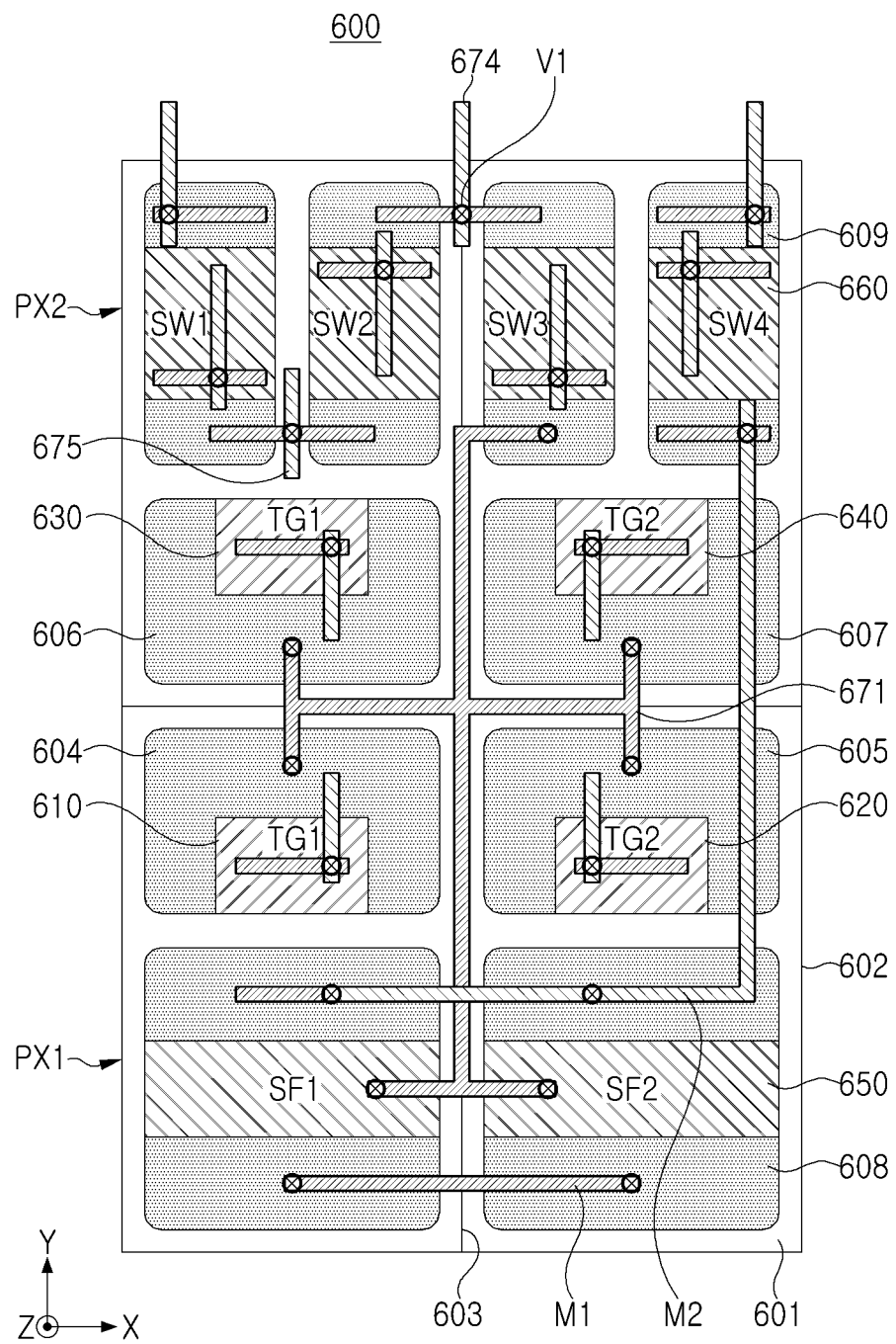

Referring to FIG. 28, a plurality of second interconnection patterns M2 may be disposed on the plurality of first interconnection patterns M1, and the plurality of second interconnection patterns M2 and the plurality of first interconnection patterns M1 may be connected to each other by a first via V1. A portion of the plurality of second interconnection patterns M2 may connect a portion of the plurality of first interconnection patterns M1 to each other. For example, in the example embodiment illustrated in FIG. 28, the first interconnection patterns M1 connected to the active regions 608 of the source-follower transistors SF1 and SF2 may be connected to the first interconnection pattern M1 connected to the active region 609 of the fourth switch transistor SW4. One interconnection pattern 674 of the plurality of second interconnection patterns M2 may provide a first node between the second reset transistor and the third reset transistor, and another interconnection pattern 675 of the plurality of second interconnection patterns M2 may provide a second node between the first reset transistor and the second reset transistor.

Figure 29:
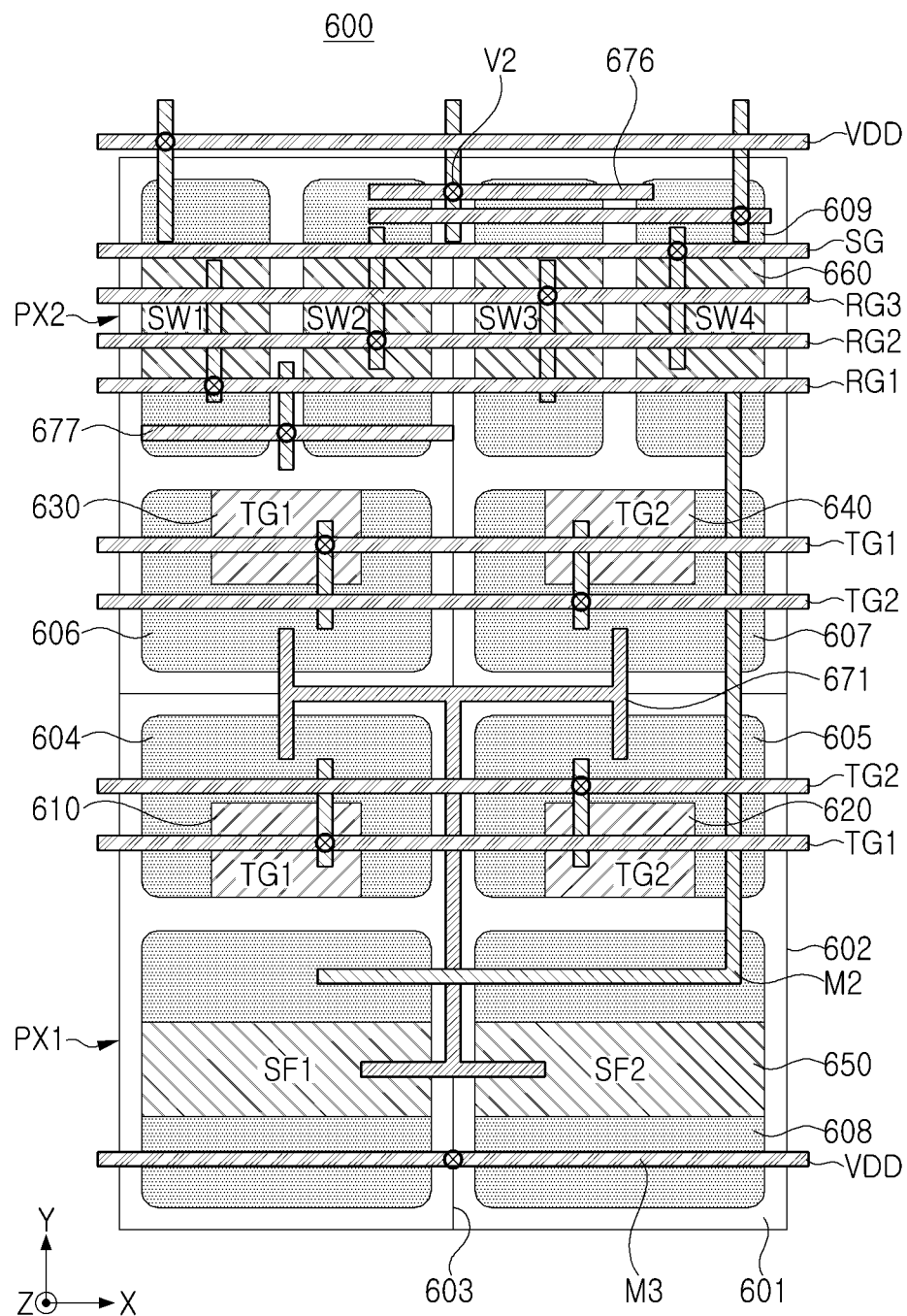

Referring to FIG. 29, a plurality of third interconnection patterns M3, which are connected to at least a portion of the plurality of second interconnection patterns M2 by second vias V2, may be disposed on the plurality of second interconnection patterns M2. The plurality of third interconnection patterns M3 may extend in the first direction.

At least a portion of the plurality of third interconnection patterns M3 may be connected to a row driver included in a peripheral circuit of the image sensor. Referring to FIG. 29, transfer paths of a selection control signal SG, reset control signals RG1 to RG3, and transfer control signals TG1 and TG2 may be provided by a portion of the plurality of third interconnection patterns M3. In addition, one interconnection pattern 676 of the plurality of third interconnection patterns M3 may provide a first node between the second reset transistor and the third reset transistor, and another interconnection pattern 677 of the plurality of third interconnection patterns M3 may provide a second node between the first reset transistor and the second reset transistor.

Figure 30:
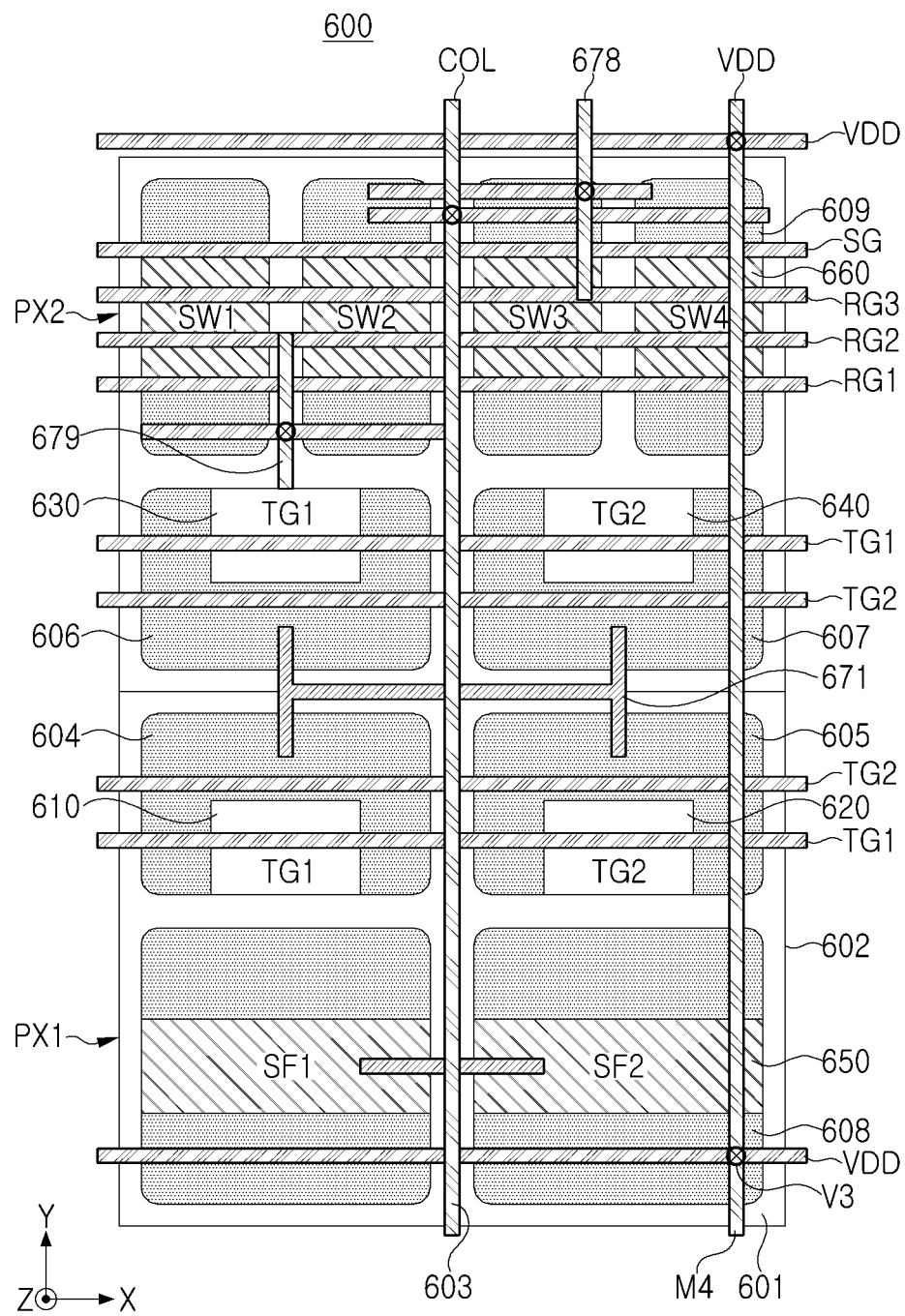

Referring to FIG. 30, a plurality of fourth interconnection patterns M4, which are connected to at least a portion of the plurality of third interconnection patterns M3 by a plurality of third vias V3, may be disposed on the plurality of third interconnection patterns M3. The plurality of fourth interconnection patterns M4 may intersect the plurality of third interconnection patterns M3, and may extend in the second direction.

At least a portion of the plurality of fourth interconnection patterns M4 may be provided as column lines COL that are connected to an ADC circuit that is included in the peripheral circuit of the image sensor. In addition, at least a portion of the plurality of fourth interconnection patterns M4 may provide a path for inputting a power supply voltage VDD into the pixels PX1 and PX2. The power voltage VDD may be input into the active region 609 of the first switch transistor SW1 and the active regions 608 of the source-follower transistors SF1 and SF2 through the first to fourth interconnection patterns M1 to M4.

One interconnection pattern 678 of the plurality of fourth interconnection patterns M4 may provide a first node at which the second reset transistor and the third reset transistor are connected to each other, and another interconnection pattern 679 of the plurality of fourth interconnection patterns M4 may provide a second node between the first reset transistor and the second reset transistor. As described above, at least one of a first node and a second node included in a single pixel group among a pair of pixel groups may be connected to at least one of a first node and a second node of another pixel group. Some fourth interconnection patterns 678 and 679 providing the first node and the second node, among the plurality of fourth interconnection patterns M4, may extend in the first direction to connect to a first node and a second node of another pixel group.

While the present inventive concept has been described with reference to embodiments thereof, it will be understood by those of ordinary skill in the art that various changes in form and details may be made thereto without departing from the spirit and scope of the present inventive concept.

What is claimed is:

1. An image sensor comprising:
a pixel array including a plurality of pixels, wherein each of the plurality of pixels includes a first photodiode, a second photodiode, a first transfer gate, a second transfer gate, and a plurality of active regions; and
a logic circuit configured to control the plurality of pixels, wherein each of a plurality of pixel groups in the pixel array includes a first pixel and a second pixel among the plurality of pixels, and the first pixel and the second pixel are adjacent to each other in a first direction,
wherein the plurality of active regions in each of the first pixel and the second pixel include a first active region and a second active region, wherein the first active region is adjacent to the first transfer gate, and the second active region is adjacent to the second transfer gate, and
wherein in each of the plurality of pixel groups, a plurality of source-follower transistors respectively has a gate connected to the first active region and the second active region of the first pixel and connected to the first active region and the second active region of the second pixel, wherein the plurality of source-follower transistors are disposed in the first pixel, and a plurality of switch transistors are disposed in the second pixel, and
in each of the plurality of pixel groups, a number of the plurality of source-follower transistors that are disposed in the first pixel is less than a number of the plurality of switch transistors that are disposed in the second pixel.

2. The image sensor of claim 1, wherein an area of each of the plurality of source-follower transistors is larger than an area of each of the plurality of switch transistors.

3. The image sensor of claim 1, wherein, in each of the plurality of pixel groups, a number of the plurality of switch transistors that are disposed in the second pixel is twice a number of the plurality of source-follower transistors that are disposed in the first pixel.

4. The image sensor of claim 1, wherein, among the plurality of active regions, active regions included in each of the plurality of source-follower transistors are arranged in the first direction.

5. The image sensor of claim 4, wherein, among the plurality of active regions, active regions included in each of the plurality of switch transistors are arranged in a second direction, intersecting the first direction.

6. The image sensor of claim 4, wherein, among the plurality of active regions, a first active region among active regions included in each of the plurality of switch transistors extends in the first direction, and a second active region extends in a second direction, intersecting the first direction.

7. The image sensor of claim 4, wherein, among the plurality of active regions, active regions included in each of the plurality of switch transistors are arranged in the first direction.

8. The image sensor of claim 4, wherein
in each of the first pixel and the second pixel, the first photodiode and the second photodiode are arranged in a second direction, substantially perpendicular to the first direction, and
among the plurality of active regions, active regions included in each of the plurality of switch transistors are arranged in a first diagonal direction, intersecting the first direction and the second direction.

9. The image sensor of claim 8, wherein gate structures of the plurality of switch transistors, which overlap the first photodiode of the second pixel, face each other in a second diagonal direction, intersecting the first diagonal direction.

10. The image sensor of claim 1, wherein
a gate structure of each of the plurality of source-follower transistors and the plurality of switch transistors is disposed on a substrate on which the first photodiode, the second photodiode, and the plurality of active regions are formed, and
at least a portion of a region of each of the first transfer gate and the second transfer gate is disposed in the substrate.

11. The image sensor of claim 1, wherein
the pixel array includes a plurality of interconnection patterns connecting the plurality of pixels to the logic circuit, and
the first active region and the second active region included in each of the first pixel and the second pixel are connected to gate structures of the plurality of source-follower transistors by a lowermost interconnection pattern among the plurality of interconnection patterns.

12. The image sensor of claim 1, wherein
the plurality of pixel groups include a first pixel group and a second pixel group adjacent to each other, and
at least one of the plurality of switch transistors included in the first pixel group is electrically connected to at least one of the plurality of switch transistors included in the second pixel group.

13. An image sensor comprising:
a pixel array including a plurality of pixel groups respectively including a first pixel and a second pixel that are adjacent to each other in a first direction; and
a logic circuit configured to drive the pixel array,
wherein each of the plurality of pixel groups includes a plurality of photodiodes, first to fourth active regions, a plurality of source-follower transistors disposed in the first pixel, and a plurality of switch transistors disposed in the second pixel, wherein the plurality of photodiodes includes at least one photodiode disposed in the first pixel and at least one photodiode disposed in the second pixel, wherein the first to fourth active regions are connected to each other by at least one of first interconnection patterns to provide a single floating diffusion region,
wherein the floating diffusion region included in a first pixel group, among the plurality of pixel groups, is connected to a floating diffusion region included in a second pixel group adjacent to the first pixel group,
wherein in each of the plurality of pixel groups, the plurality of switch transistors include first to third reset transistors connected to each other in series between a power node, which supplies a power voltage, and the floating diffusion region, and
wherein a first node among nodes that are between the first to third reset transistors, which are included in the first pixel group, is connected to a second node among nodes that are between the first to third reset transistors, which are included in the second pixel group.

14. The image sensor of claim 13, wherein, when an external illuminance level is higher than a predetermined reference illuminance level, the logic circuit is configured to turn off the first reset transistor included in the second pixel group and to turn on the second reset transistor and the third reset transistor in the second pixel group to reduce a conversion gain of the first pixel group.

15. The image sensor of claim 13, wherein, when an external illuminance level is lower than a predetermined reference illuminance level, the logic circuit is configured to turn off the first to third reset transistors included in the second pixel group to increase a conversion gain of the first pixel group.

16. The image sensor of claim 13, wherein
the first reset transistor is connected to the power node, and the third reset transistor is connected to the floating diffusion region, and
a node between the first reset transistor and the second reset transistor included in the first pixel group is connected to a node between the first reset transistor and the second reset transistor included in the second pixel group.

17. The image sensor of claim 13, wherein an area of each of the plurality of source-follower transistors is larger than an area of each of the plurality of switch transistors.

18. The image sensor of claim 13, wherein
the plurality of source-follower transistors are connected to each other in parallel, and
the plurality of switch transistors include a selection transistor connected to output terminals of the plurality of source-follower transistors.

19. The image sensor of claim 13, wherein a shape of each of the plurality of switch transistors is different from that of each of the plurality of source-follower transistors.

20. An image sensor comprising:
a substrate including a plurality of pixel regions;
a plurality of pixels disposed in the plurality of pixel regions, respectively, wherein each of the plurality of pixels includes a first photodiode, a second photodiode, a first transfer gate, a second transfer gate, and a plurality of active regions; and
a logic circuit connected to the plurality of pixels,
wherein the plurality of pixels provide a plurality of pixel groups, wherein each of the plurality of pixel groups includes a first pixel and a second pixel adjacent to each other in a first direction,
each of the first pixel and the second pixel includes a plurality of transistors including gate structures and a portion of the plurality of active regions, wherein the gate structures are different from the first transfer gate and the second transfer gate, and
in each of the plurality of pixel groups, a number of the plurality of transistors disposed in the first pixel is different from a number of the plurality of transistors disposed in the second pixel.

* * * * *